(12) United States Patent
Sun et al.

(10) Patent No.: US 11,447,655 B2
(45) Date of Patent: Sep. 20, 2022

(54) REVERSIBLE MULTI-RESPONSIVE AND MULTI-PATTERNED NANOCOATINGS

(71) Applicants: KANEKA CORPORATION, Osaka (JP); THE UNIVERSITY OF CONNECTICUT, Storrs, CT (US)

(72) Inventors: Luyi Sun, Storrs, CT (US); Jingjing Liu, Storrs, CT (US); Songshan Zheng, Storrs, CT (US); Thomas D'Auria, Storrs, CT (US); Young Hoon Lim, Osaka (JP); Tianlei Zhou, Osaka (JP); Masaya Kotaki, Osaka (JP)

(73) Assignees: Kaneka Corporation, Osaka (JP); The University of Connecticut, Storrs, CT (US)

( * ) Notice: Subject to any disclaimer, the term of this patent is extended or adjusted under 35 U.S.C. 154(b) by 208 days.

(21) Appl. No.: 16/639,010

(22) PCT Filed: Aug. 17, 2018

(86) PCT No.: PCT/US2018/046945
§ 371 (c)(1),
(2) Date: Feb. 13, 2020

(87) PCT Pub. No.: WO2019/036648
PCT Pub. Date: Feb. 21, 2019

(65) Prior Publication Data
US 2020/0362189 A1      Nov. 19, 2020

Related U.S. Application Data

(60) Provisional application No. 62/547,444, filed on Aug. 18, 2017.

(51) Int. Cl.
| | | |
|---|---|---|
| C09D 129/04 | (2006.01) | |
| C09D 7/61 | (2018.01) | |
| C23C 14/18 | (2006.01) | |
| C23C 14/34 | (2006.01) | |
| B05D 1/00 | (2006.01) | |
| B05D 1/02 | (2006.01) | |
| C08K 3/34 | (2006.01) | |

(52) U.S. Cl.
CPC ............ C09D 129/04 (2013.01); C09D 7/61 (2018.01); C23C 14/185 (2013.01); C23C 14/34 (2013.01); B05D 1/005 (2013.01); B05D 1/02 (2013.01); C08K 3/346 (2013.01); Y10T 428/31692 (2015.04)

(58) Field of Classification Search
CPC ............................. C09D 129/04; C03C 17/36
See application file for complete search history.

(56) References Cited

U.S. PATENT DOCUMENTS

2015/0315404 A1* 11/2015 Sun .................... B05D 1/18
                                                                427/487

* cited by examiner

*Primary Examiner* — Ian A Rummel
(74) *Attorney, Agent, or Firm* — Morgan, Lewis & Bockius LLP

(57) ABSTRACT

Hybrid organic/inorganic coating compositions of nanometer thickness are described, where the organic layer is a clay-containing layer comprising a clay and a hydrophilic polymer and the inorganic layer is a metal-containing layer comprising a metal with a refractive index greater than 1.5, where the coating compositions allow for the generation and tenability of iridescent color through control of the coat thickness.

34 Claims, 22 Drawing Sheets

| TIME | THICKNESS |
|---|---|
| 2 MIN | 10 nm |
| 4 MIN | 18 nm |
| 8 MIN | 30 nm |

2 MINUTES

5 MINUTES

8 MINUTES

REVERSIBLE MULTI-RESPONSIVE AND MULTI-PATTERNED NANOCOATINGS

PARTIES TO JOINT RESEARCH AGREEMENT

This invention was developed under and was made as a result of activities undertaken within the scope of a Joint Research Agreement between Kaneka Corporation and The University of Connecticut, which agreement was in effect on and before the date the claimed invention was made.

FIELD OF THE INVENTION

The invention relates to nanocomposite coatings comprising a hydrophilic polymer and a clay, where the coatings exhibit iridescence upon exposure to water. The invention also relates to the preparation of such nanocomposite coatings and their use in various applications.

BACKGROUND OF THE INVENTION

Iridescence is a type of structural color that arises from the interaction of light with the variations present in a periodic structure. More specifically, iridescence occurs when light waves encounter a surface and scatter at various angles based on the surface's texture. The reflected waves superimpose on each other with the result that when the scattered wavelengths are similar, they reinforce each other (constructive interference), and when the crests of one wavelength aligns with the troughs of another wavelength, they cancel each other out (destructive interference). This interplay of constructive and destructive interference creates the iridescence phenomenon. Representative examples include butterfly wings, peacock feathers and soap bubbles. Iridescent colors are not static and change in response to stimuli from the external environment. As a result, iridescence show promise for use in applications such as chemical/physical sensors and optical devices. The presence of iridescent colors in nature has also inspired an extensive investigation into their use in bio-mimetic stimuli-responsive materials. The structural periodicity and the refractive indices of these materials can be adjusted to produce unique optical properties when exposed to external stimuli such as light, pH, solvent, temperature, humidity, and mechanical forces.

The present invention addresses the unmet need for tunable iridescent materials by disclosing the preparation of ultra-thin nanocomposite coatings capable of altering their iridescent colors upon variation of the coat thickness and exposure to external stimuli.

SUMMARY OF THE INVENTION

An aspect of the invention is a composition comprising: a metal-containing layer comprising a metal having a refractive index of less than 1 (<1) or greater than 2 (>2) in the visible light range; and one or more clay-containing layers where the clay-containing layer comprises a clay and a hydrophilic polymer, wherein the composition exhibits iridescence upon exposure to a water-containing liquid.

In an exemplary embodiment, the clay-containing layer is in direct contact with the metal-containing layer.

In an exemplary embodiment, the metal in the metal-containing layer is selected from the group consisting of Al, Au, Ag, Pt, Ti, Cu, Zn, Fe, Ni, Sn, Cr, Co, W, Pd and combinations thereof.

In a particular embodiment, the metal in the metal-containing layer is Au/Pd.

In an exemplary embodiment, the clay in the one or more clay-containing layers is present as a sheet.

In an exemplary embodiment, the clay in the one or more clay-containing layers is selected from the group consisting of montmorillonite, $\alpha$-zirconium phosphate $((Zr(HPO_4)_2 \cdot nH_2O))$, graphene oxide, layered double hydroxides, boron nitride, laponite, $WS_2$, $MoS_2$, $MoSe_2$ and mixtures thereof.

In a particular embodiment, the clay in the one or more clay-containing layers is laponite.

In an exemplary embodiment, the hydrophilic polymer in the one or more clay-containing layers is selected from the group consisting of polyethylene glycol (PEG), polysaccharides (e.g., cellulose and chitosan), polyvinyl alcohol (PVA), polyacrylic acid, polyvinylpyrrolidone (PVP), polyacrylamides, polyamines, polyethyleneamines, poly(3,4-ethylenedioxythiophene)-poly(styrenesulfonate), poly(styrenesulfonate) and mixtures thereof.

In a particular embodiment, the hydrophilic polymer in the one or more clay-containing layers is polyvinyl alcohol.

In a particular embodiment, the metal in the metal-containing layer is Au/Pd, the clay in the one or more clay-containing layers is laponite and the hydrophilic polymer in the one or more clay-containing layers is polyvinyl alcohol.

In an exemplary embodiment, at least a portion of the clay and the hydrophilic polymer in the one or more clay-containing layers is not crosslinked.

In an exemplary embodiment, at least a portion of the clay and the hydrophilic polymer in the one or more clay-containing layers is crosslinked.

In a particular embodiment, at least a portion of the clay and the hydrophilic polymer in the one or more clay-containing layers is physically crosslinked.

In an exemplary embodiment, one or more of the clay-containing layers further comprises a crosslinking agent.

In an exemplary embodiment, the crosslinking agent causes chemical crosslinking between the clay and the hydrophilic polymer.

In an exemplary embodiment, the crosslinking agent is selected from the group consisting of a dialdehyde, boric acid, a borate salt (such as, but not limited to, $Mg_2B_2O_5$, $CaAlB_3O_7$; and $Li_6B_4O_9$) and mixtures thereof.

In an exemplary embodiment, the dialdehyde includes, but is not limited to, glyoxal, malondialdehyde, succinaldehyde, glutaraldehyde, adipaldehyde, phthalaldehyde, isophthalaldehyde, terephthalaldehyde, 2,6,11,15-tetramethyl-2,4,6,8,10,12,14-hexadecaheptaenedial, 2-hydroxy-5-methyl-1,3-benzenedicarboxaldehyde and 2,5-thiophenedicarboxaldehyde.

In a particular embodiment, the dialdehyde is glutaraldehyde and the borate salt is borax.

In an exemplary embodiment, at least 20%, such as at least 50%, such as at least 75%, such as at least 90% of the clay and the hydrophilic polymer present in the one or more clay-containing layers are crosslinked.

In an exemplary embodiment, between 20 and 50%, such as between 50 and 75%, such as between 75 and 95%, of the clay and the hydrophilic polymer present in the one or more clay-containing layers are crosslinked.

In an exemplary embodiment, a portion of the clay and the hydrophilic polymer in the one or more clay-containing layers is physically crosslinked and another portion is not crosslinked.

In an exemplary embodiment, a portion of the clay and the hydrophilic polymer in the one or more clay-containing layers is chemically crosslinked and another portion is not crosslinked.

In an exemplary embodiment, a portion of the clay and the hydrophilic polymer in the one or more clay-containing layers is chemically crosslinked and another portion is physically crosslinked.

In a particular embodiment, the crosslinked clay is laponite and the crosslinked hydrophilic polymer is polyvinyl alcohol, where the laponite and the polyvinyl alcohol are crosslinked to each other either directly or through a crosslinking agent.

In a particular embodiment, the water-containing liquid is in vapor form. In a particular embodiment, the water-containing liquid is water introduced as cool mist or is water introduced in a nebulized form.

In a particular embodiment, the water-containing liquid is water.

In an exemplary embodiment, the iridescence varies depending on the thickness of the one or more clay-containing layers.

In a particular embodiment, the laponite and the polyvinyl alcohol are present in a mass ratio of approximately 1:1.

Another aspect of the invention is a nanocomposite coating comprising the composition as described herein.

In an exemplary embodiment, the iridescence disappears when at least a portion of the water (including substantially all of the water) present in the coating is removed from the coating.

In a particular embodiment, the metal-containing layer is at least 20 nm in thickness.

In a particular embodiment, the crosslinking agent is used to create a writable pattern on the coating.

Another aspect of the invention is a method of coating a surface (such as a glass surface) with an iridescence-generating composition, the method comprising: applying to the surface a metal-containing layer comprising a metal with a refractive index of less than 1 (or greater than 2) in the visible light range; applying one or more clay-containing layers comprising a clay and a hydrophilic polymer directly or indirectly on the metal-containing layer; and applying a crosslinking agent to the one or more of the clay-containing layers to crosslink at least a portion of the clay with the hydrophilic polymer.

In an exemplary embodiment, the method further comprises adding a sufficient amount of water (in any suitable form, such as vapor) to the one or more clay-containing layers to cause the composition to exhibit iridescence.

In an exemplary embodiment, the method further comprises removing the water present in the more or more clay-containing layers to the extent needed to make the iridescence disappear.

In an exemplary embodiment, the method further comprises applying additional layers of the clay-containing layer as needed to achieve desired iridescence of the composition.

Another aspect of the invention is an article comprising a composition as described herein.

BRIEF DESCRIPTION OF THE DRAWINGS

Specific embodiments of the invention are described below with reference to the figures accompanying this application. The scope of the invention is not limited to the figures.

Three coating systems were designed and tested for purposes of comparison as follows:

System 1: Pure polyvinyl alcohol (PVA). Without the reinforcement provided by a suitable clay (e.g., laponite), the PVA was observed (see FIG. 3A) to lack dimensional stability upon exposure to moisture.

System 2: PVA/Laponite composite with physical crosslinking. When the PVA and laponite were physically crosslinked, it was observed (see FIG. 3B) that the resulting composite was sensitive to moisture but maintained its dimensional stability. The crosslinking was observed to provide the coating composition with the ability to respond to introduced water in a dynamic fashion.

System 3: PVA/Laponite composite with chemical crosslinking. When the PVA and laponite were chemically crosslinked (via a crosslinking agent), it was observed that the resulting composite was less sensitive to introduced water compared to the physically crosslinked composite.

Figure 1:
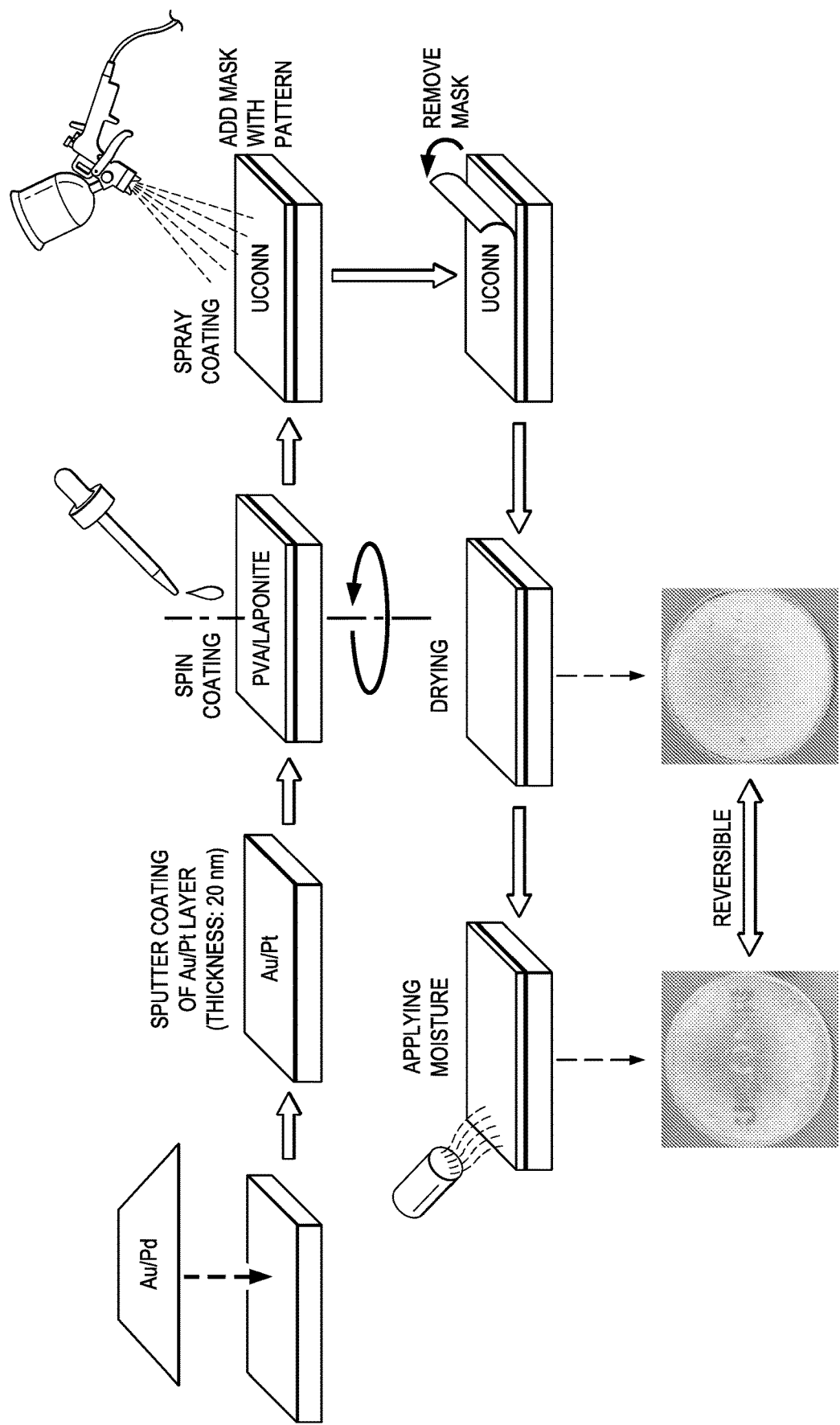

FIG. 1 depicts the preparation of an iridescent hybrid nanocomposite of the present invention and demonstrates the reversible nature of the iridescence that is observed by the addition and removal of moisture.

Figure 2A:
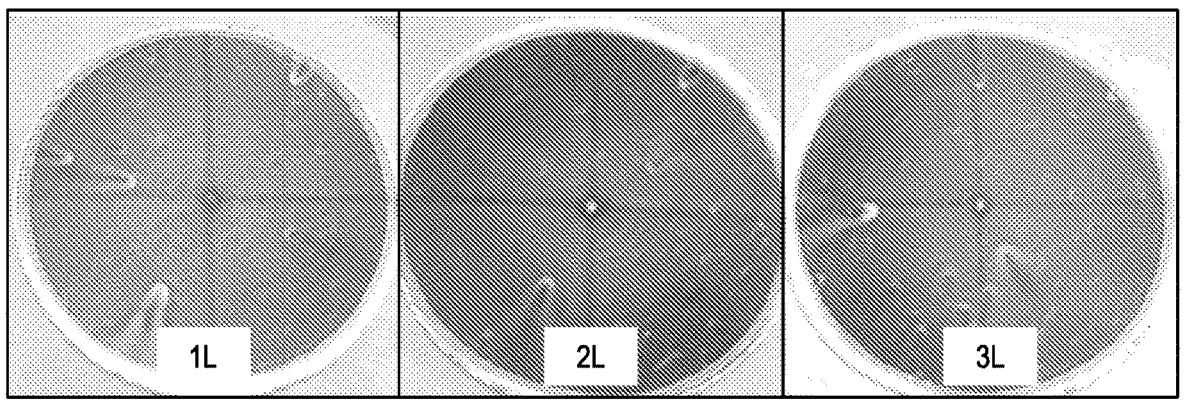

FIG. 2A illustrates that in the absence of physical or chemical crosslinking, dimensional stability of the coating composition was not maintained. Also, the coat was not capable of forming multiple layers after a series of coating cycles, such as from one time (1 L) to three times (3 L) because during each cycle of coating, the previous layer was likely to be dissolved and lost.

Figure 2B:
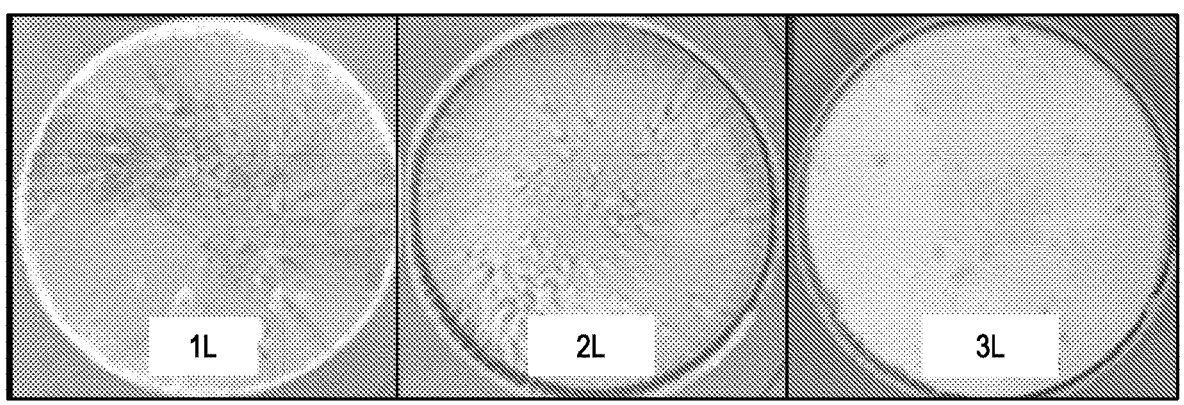

FIG. 2B illustrates that in contrast to FIG. 2A, physical crosslinking achieved by the use of laponite nanosheets resulted in a coat that exhibited high dimensional stability and an increased thickness through accumulated coating cycles, from one time (1 L) to three times (3 L). The nanostructure and the interlayer distances between the nanosheets were not observed to be the key factors in generating the iridescent colors, but they may have affected the response time of the coat to moisture.

Figure 3A:
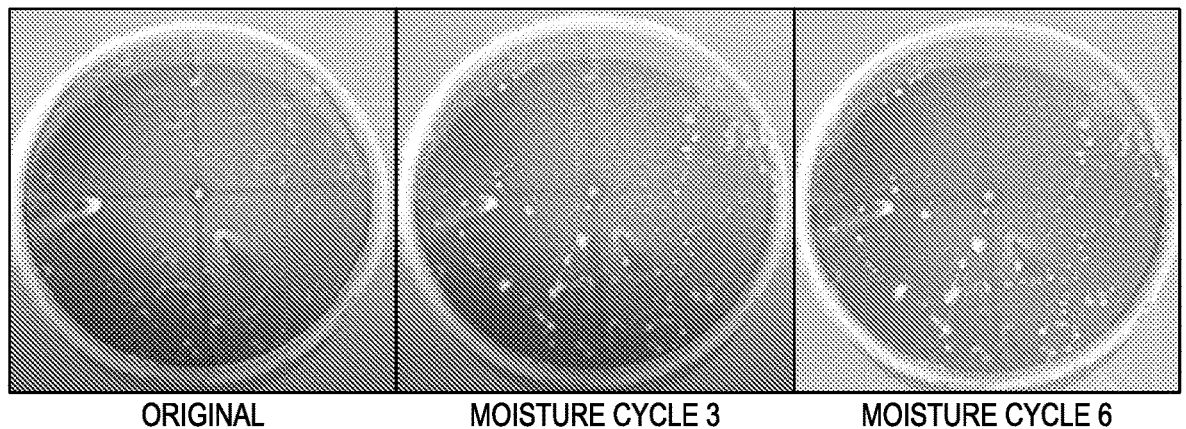

FIG. 3A illustrates that when the System 1 type of nanocoat (the nanocoat with PVA but no clay) was exposed to moisture, the nanocoat did not display any dimensional stability. Surface defects appeared after 6 cycles of moisture application due to the high solubility of PVA in water.

Figure 3B:
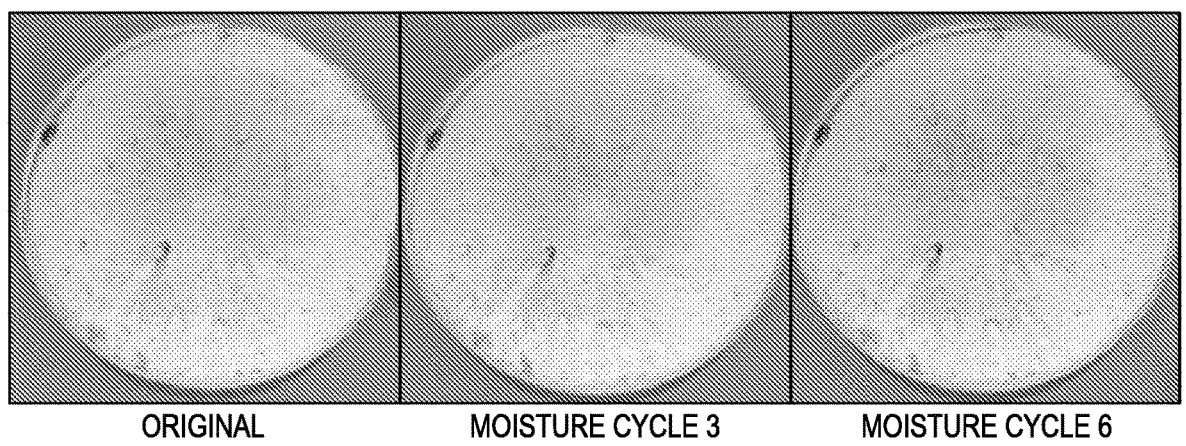

FIG. 3B illustrates that in contrast to FIG. 3A, the coat containing laponite (System 2) exhibited high dimensional stability. As a result of the physical crosslinking between PVA and laponite, there were no visible defects on the coat surface after 6 cycles and even more than 50 cycles (not shown) of applying moisture.

Figure 4:
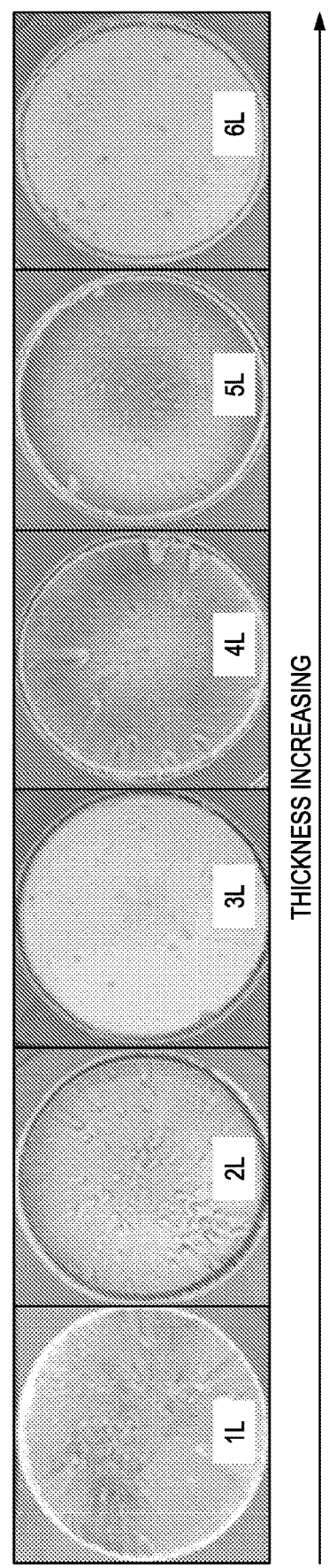

FIG. 4 illustrates a uniform and bright iridescent surface color that was achieved by manipulating the coat thickness, i.e., by increasing the coating cycle from 1 time (1 L) to 6 times (6 L) in a System 2 coat. The dependency of the appearance of different iridescent colors on the coat thickness clearly demonstrated the beneficial effect of physical crosslinking.

Figure 5A:
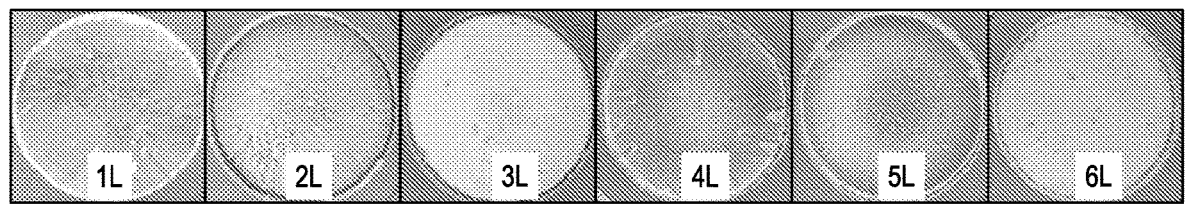
Figure 5B:
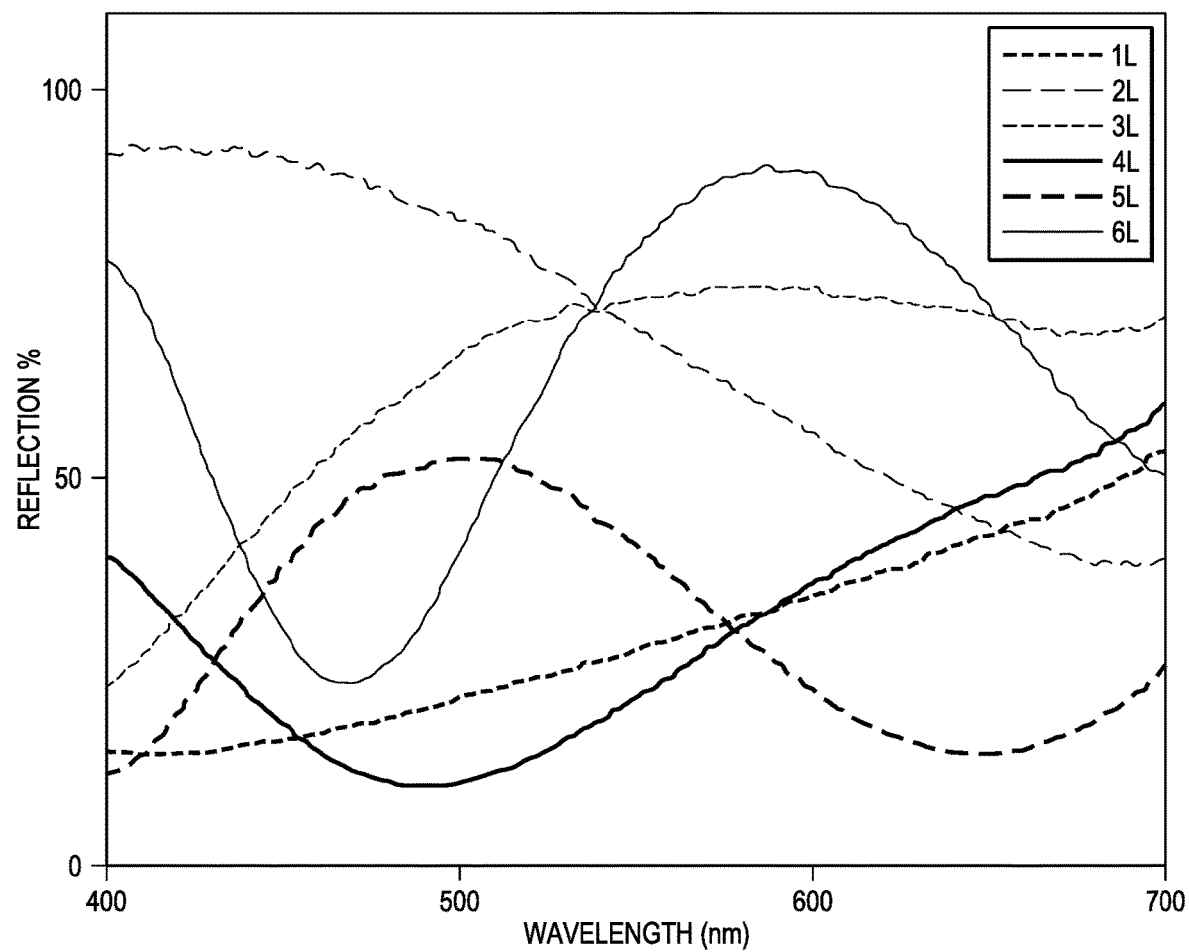

FIG. 5A illustrates the tunable optical properties of the coat layer (i.e., a change in coat color with each additional coating cycle) presented in the reflectance spectrum in FIG. 5B, which also illustrates the relationship between the thickness of the layer and the reflective wavelength peak position.

Figure 6:
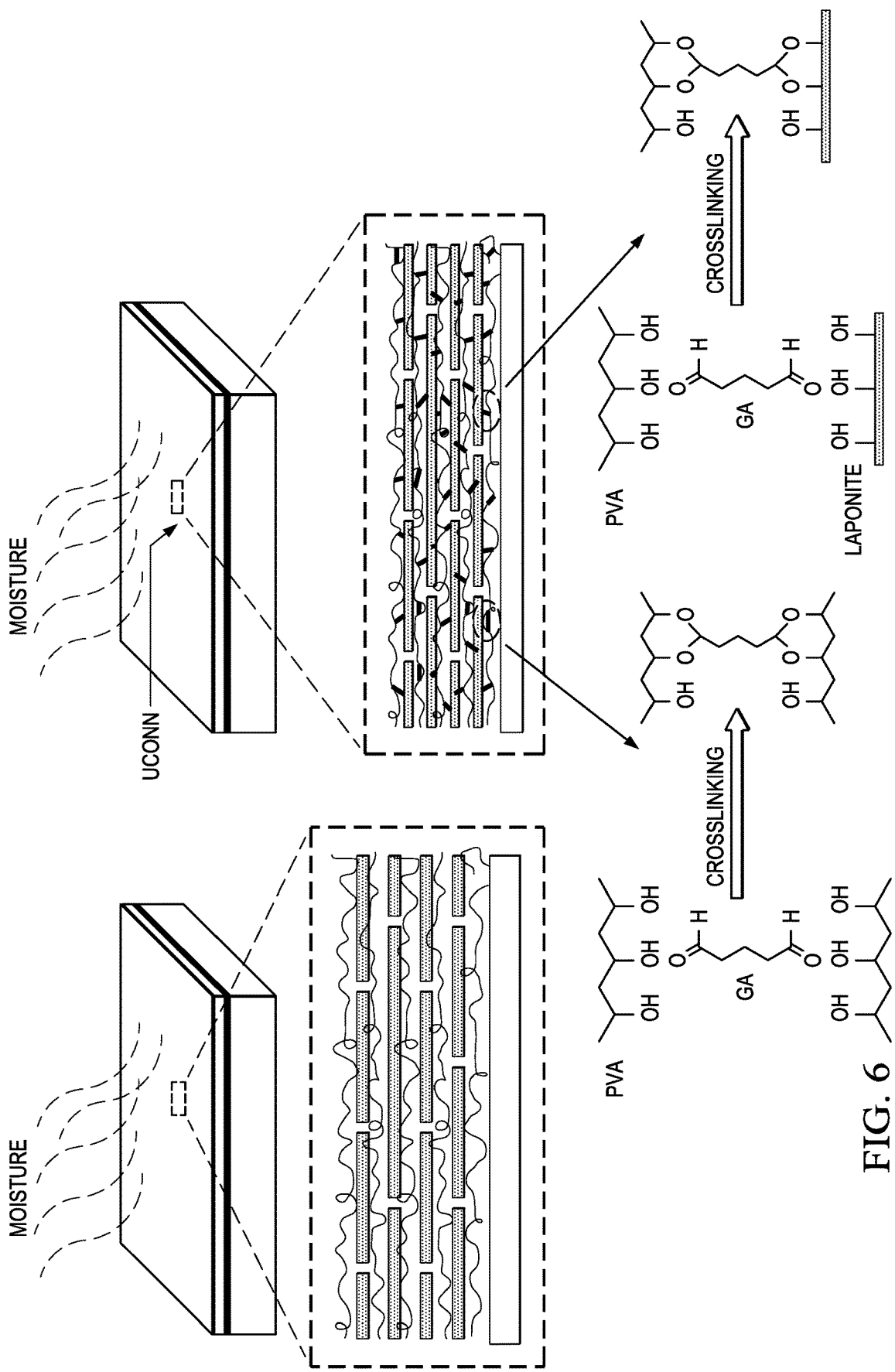

FIG. 6 illustrates a System 3 design in which the PVA and the laponite chemically crosslinked. As a result of this chemical crosslinking, the system was observed to be no longer sensitive to moisture. A patterned mask in the shape of the UCONN logo was constructed as shown in FIG. 6. The unmasked portion of the UCONN logo was then directly exposed to a crosslinking agent (glutaraldehyde (GA)) by spray coating. When the cool water mist was applied to the surface, the difference in sensitivity to moisture between the masked and unmasked regions triggered a change in coat thickness, leading to a color change in the physical and chemical crosslinked region. This swelling and shrinking process with surface color change was observed to be reversible.

Figure 7:
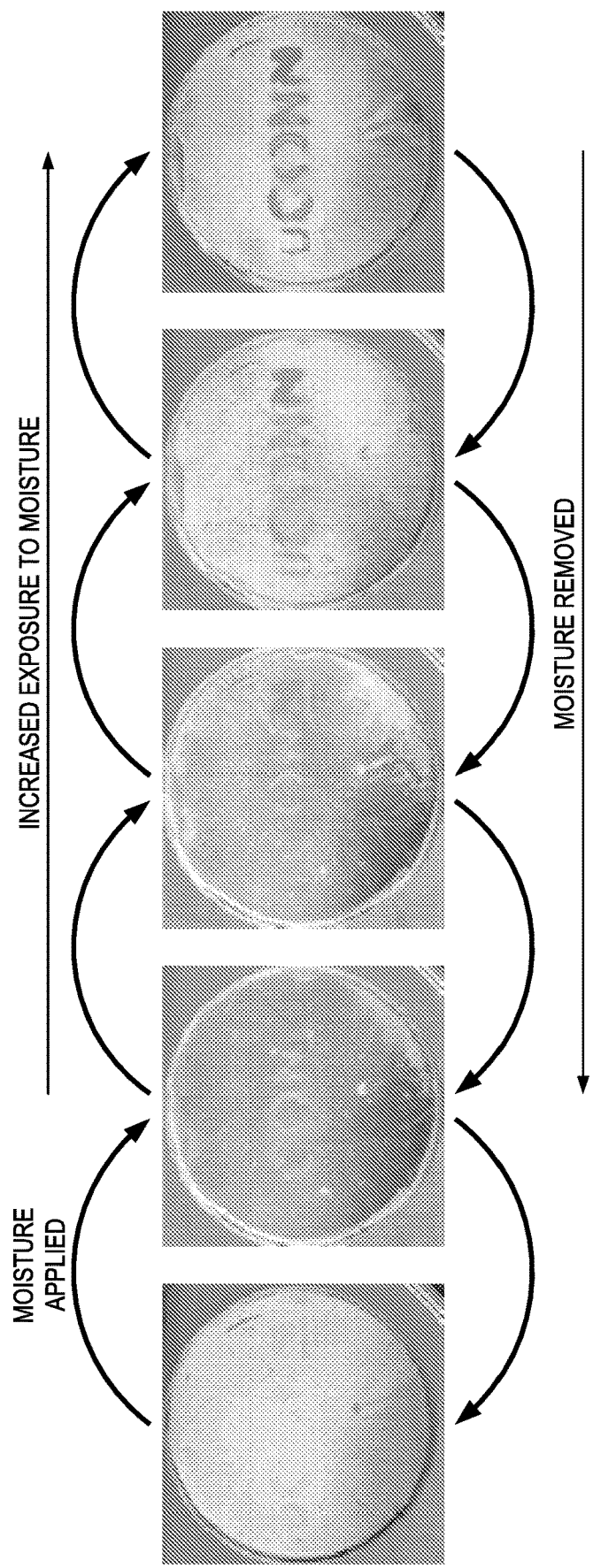
Figure 8A:
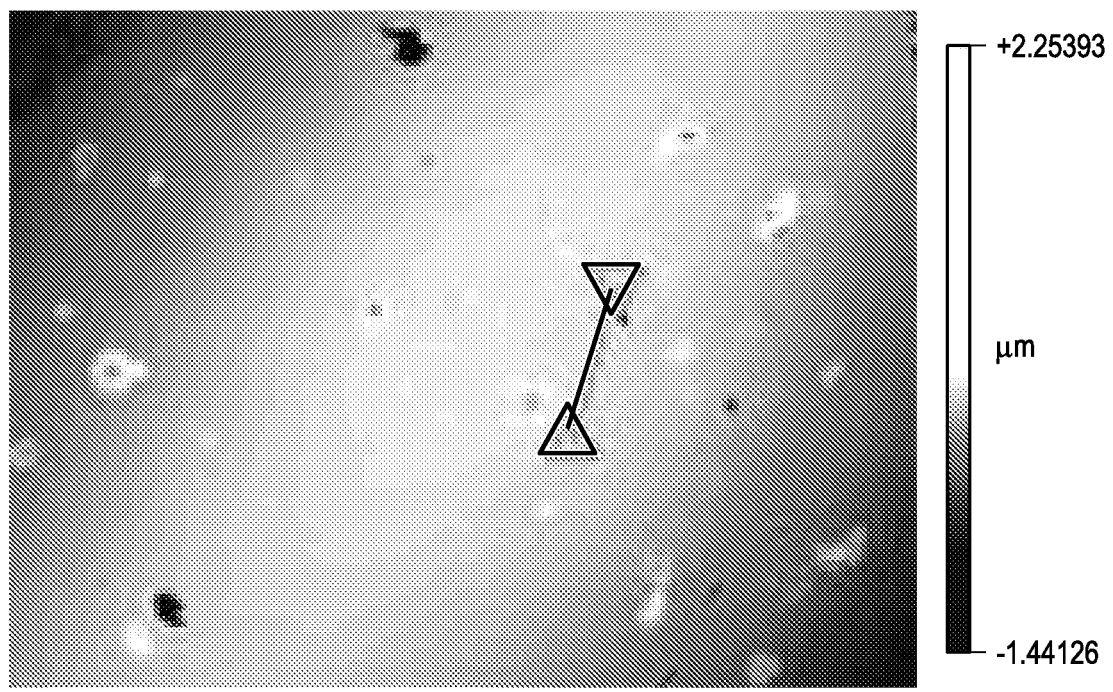
Figure 8B:
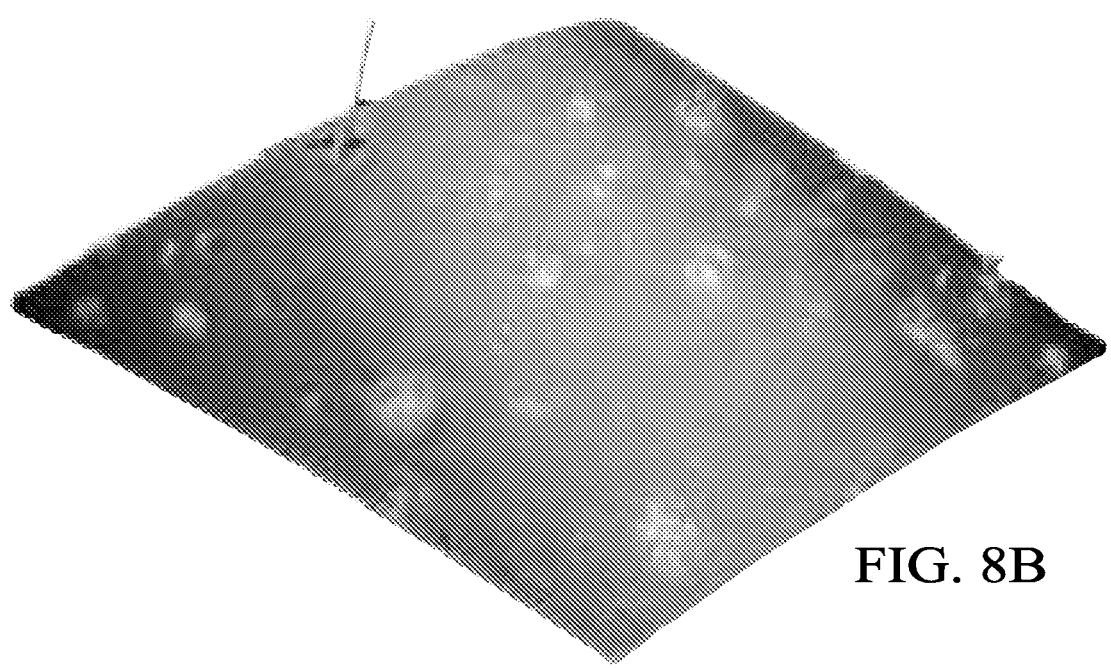
Figure 8C:
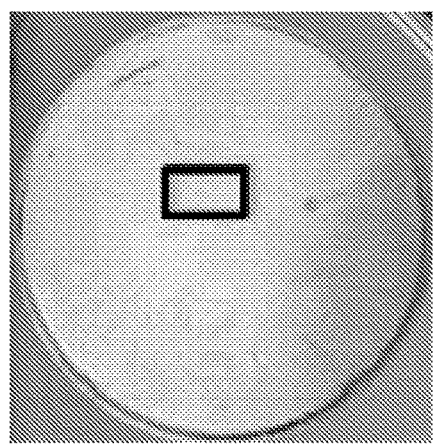
Figure 8D:
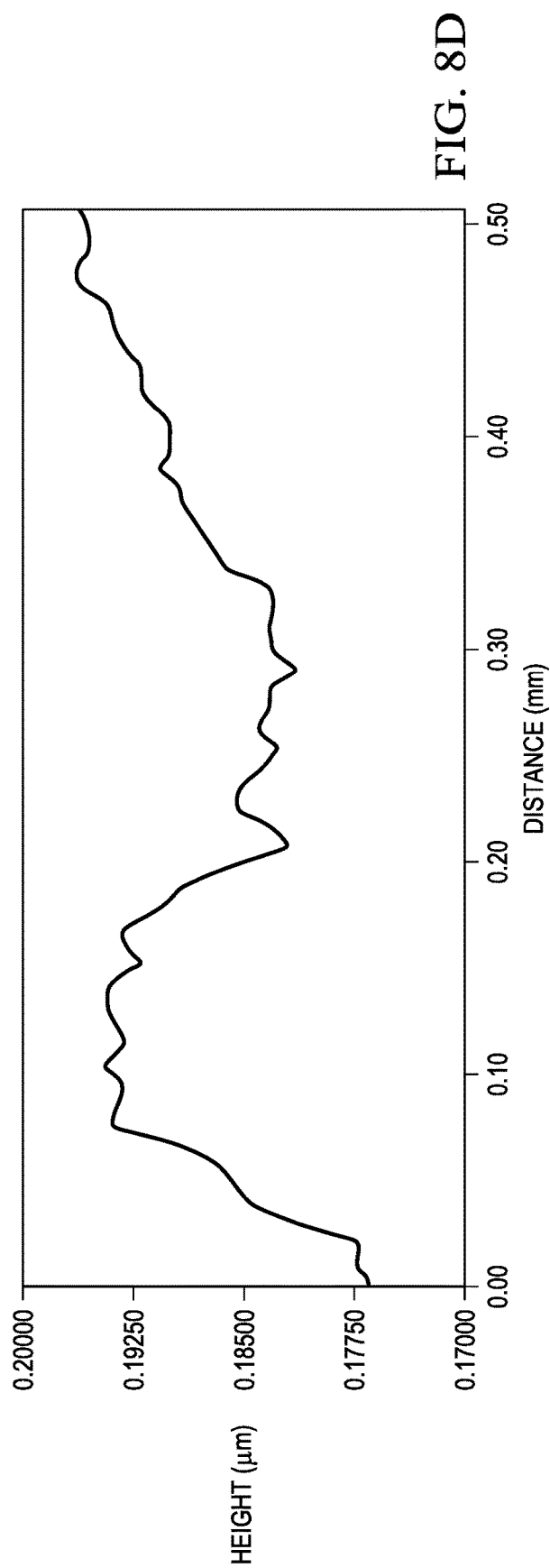
Figure 8E:
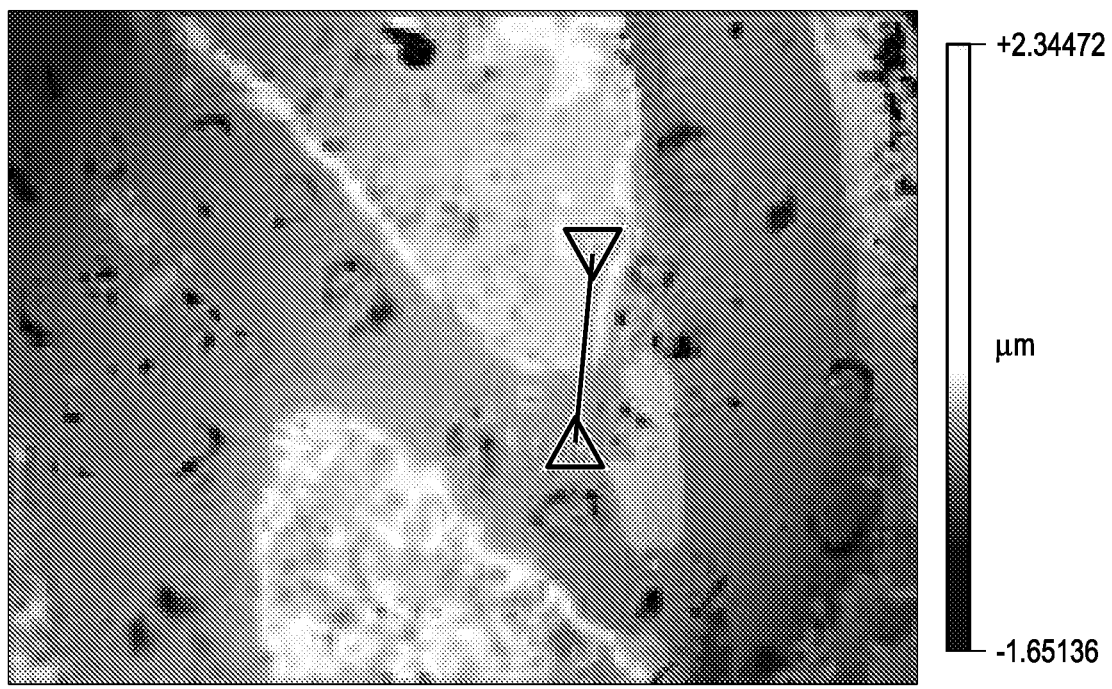
Figure 8F:
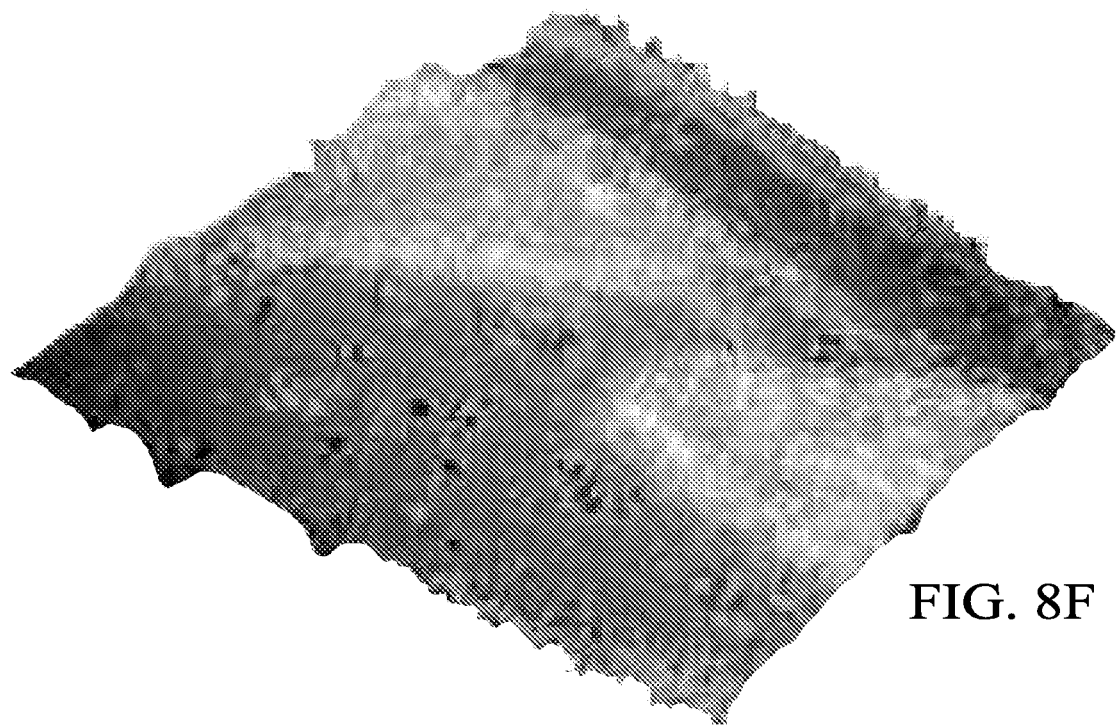
Figure 8G:
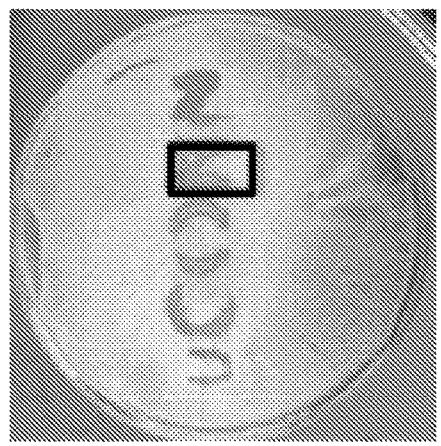
Figure 8H:
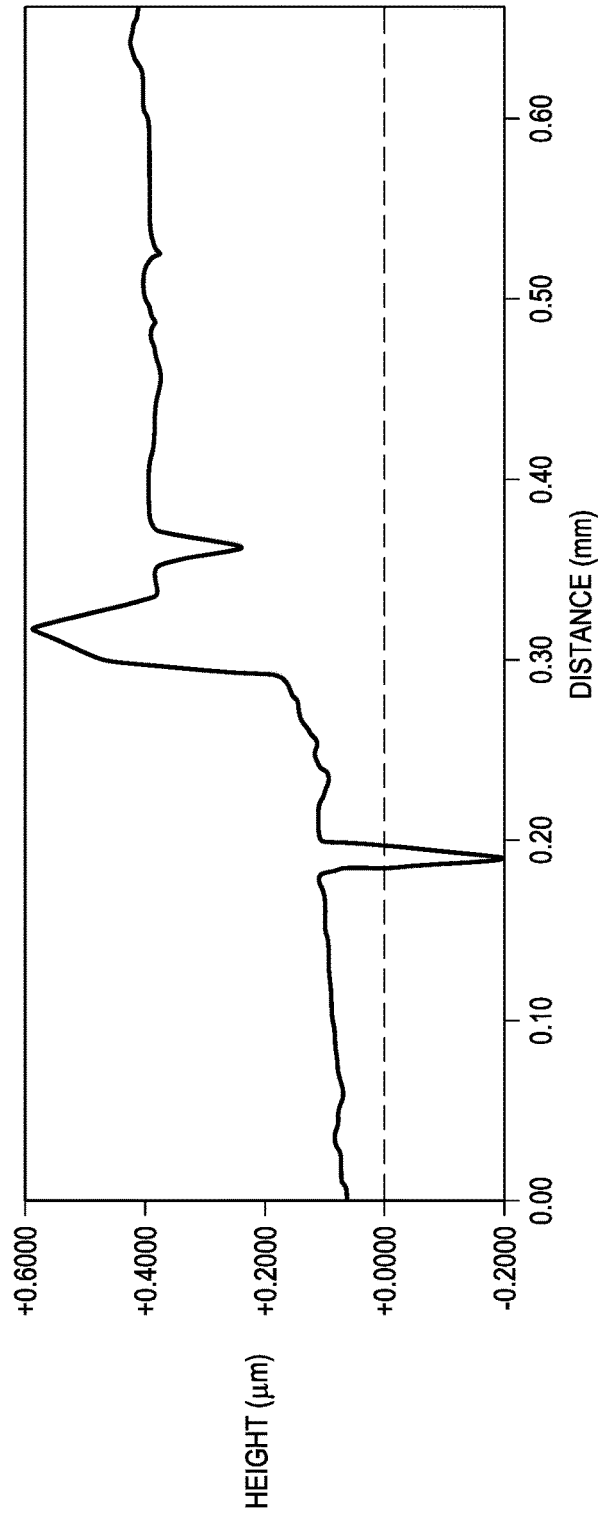
Figure 9:
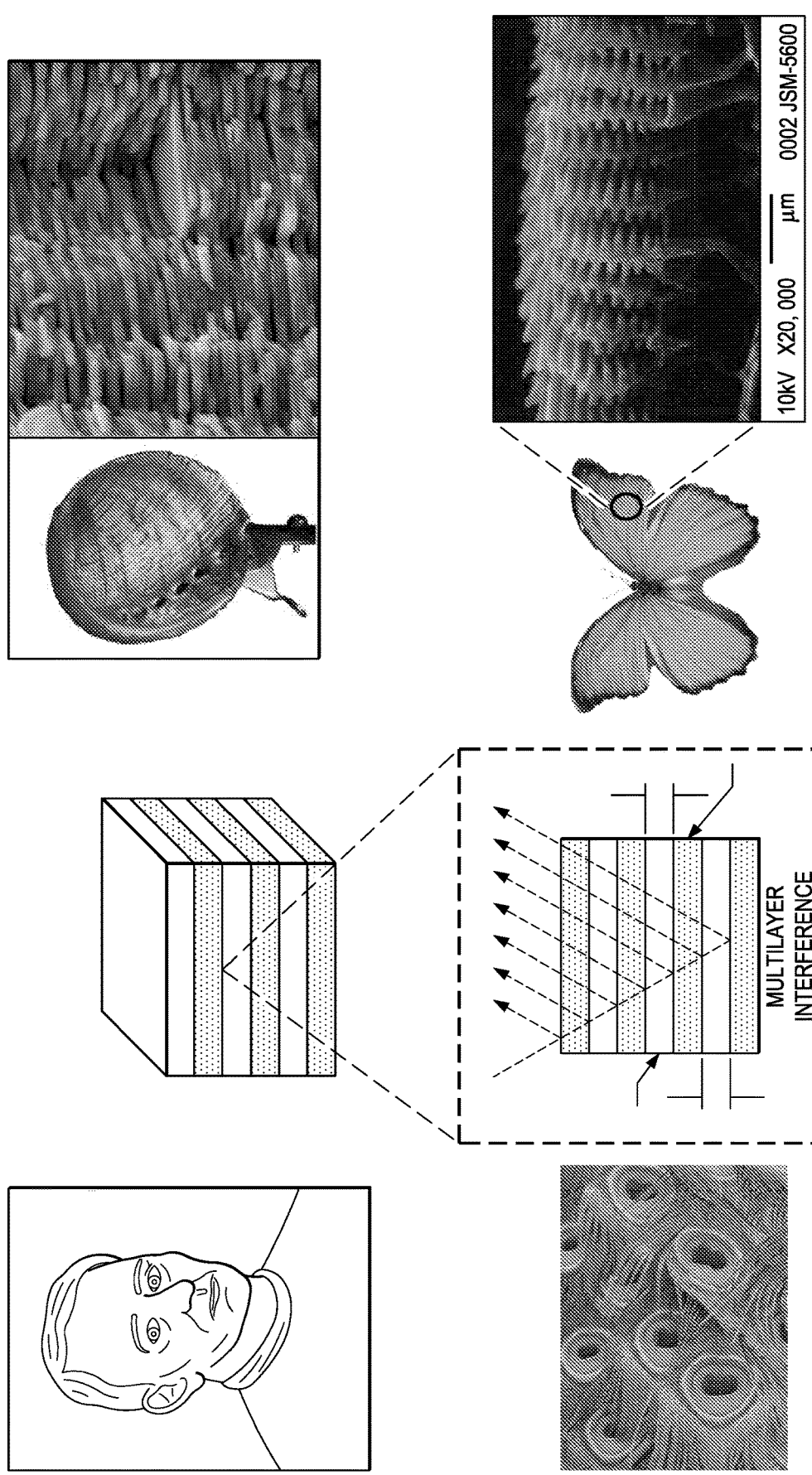
Figure 10:
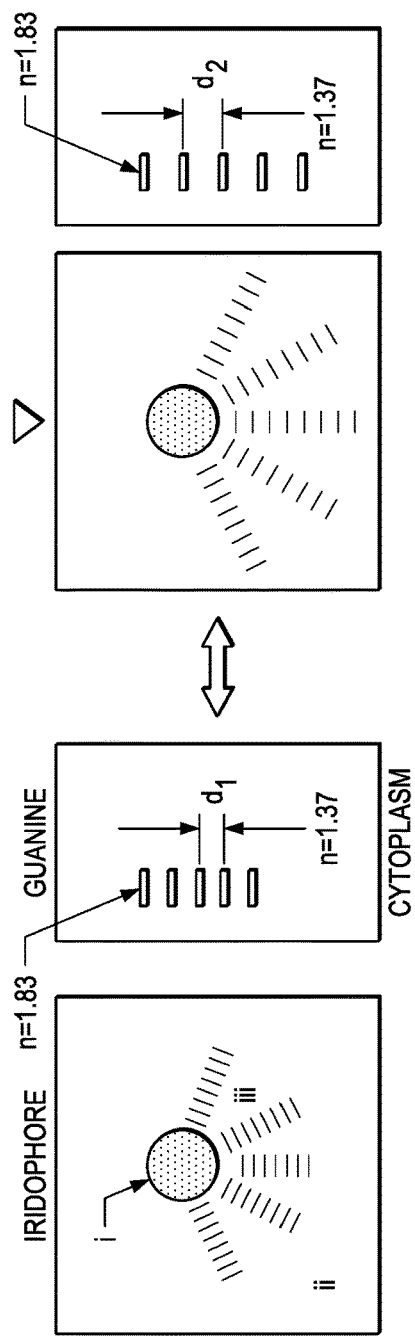
Figure 11:
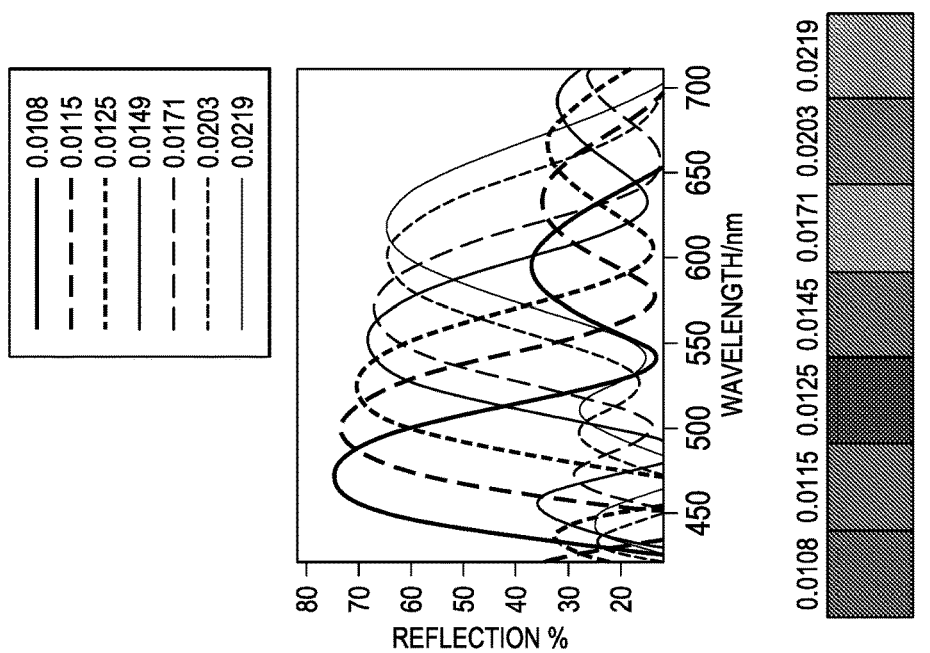
Figure 11:
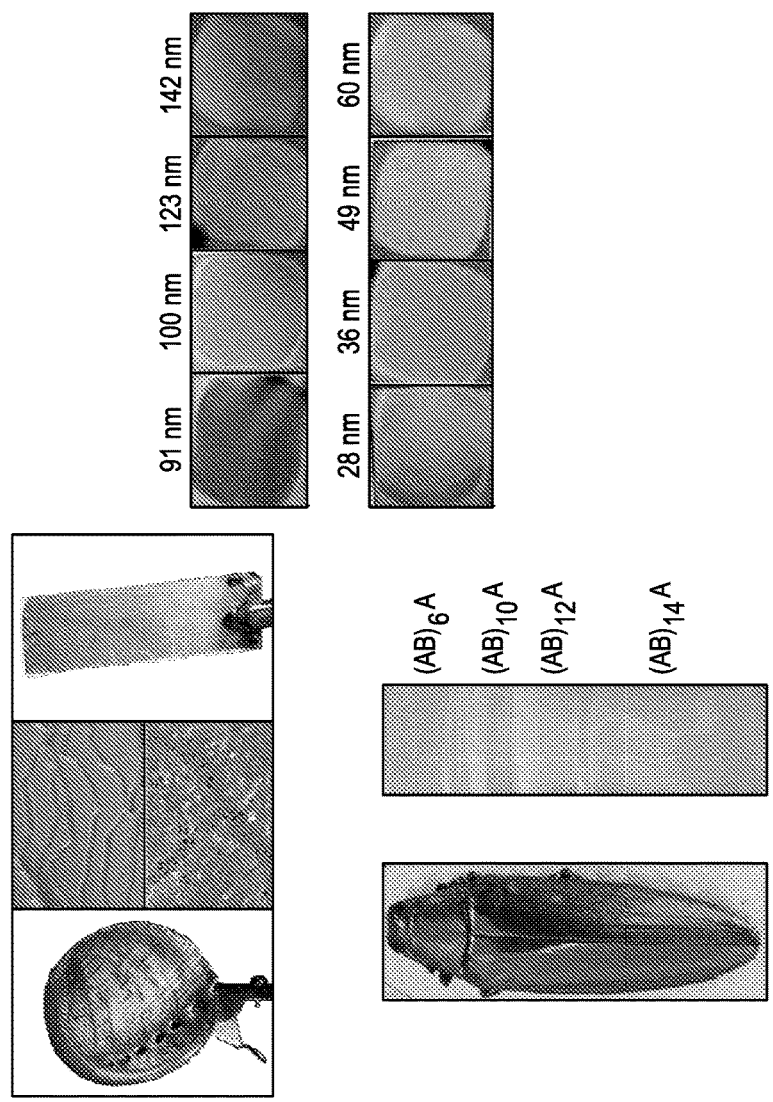
Figure 12A:
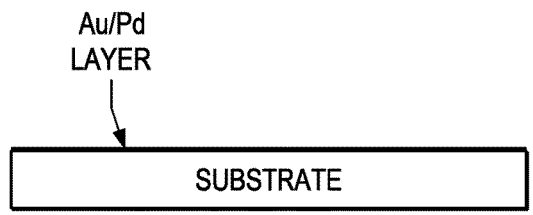
Figure 12A:
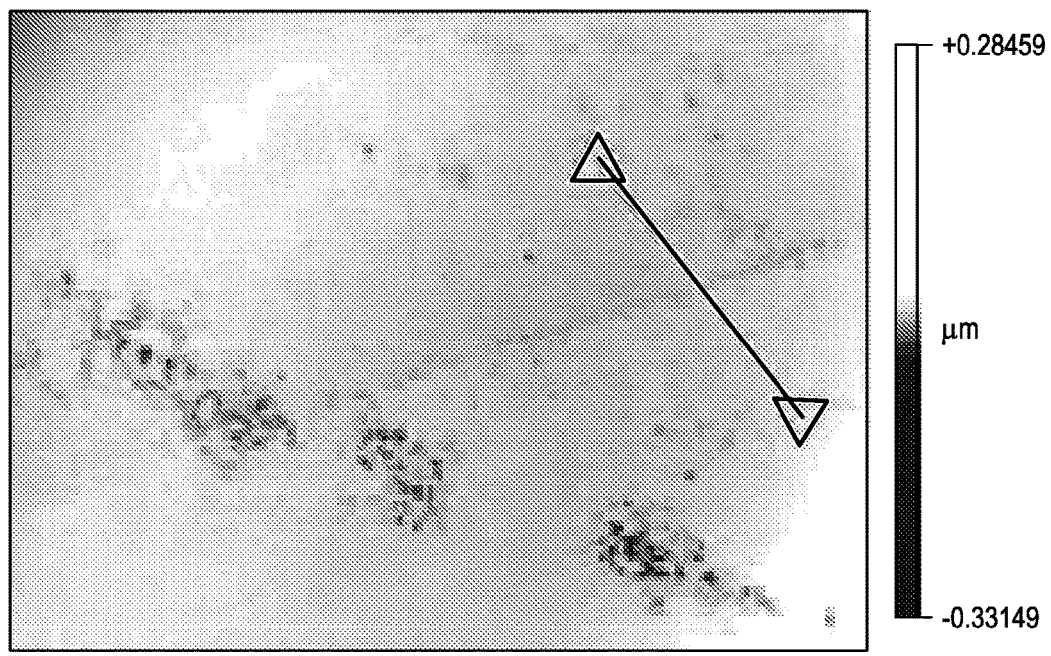
Figure 12A:
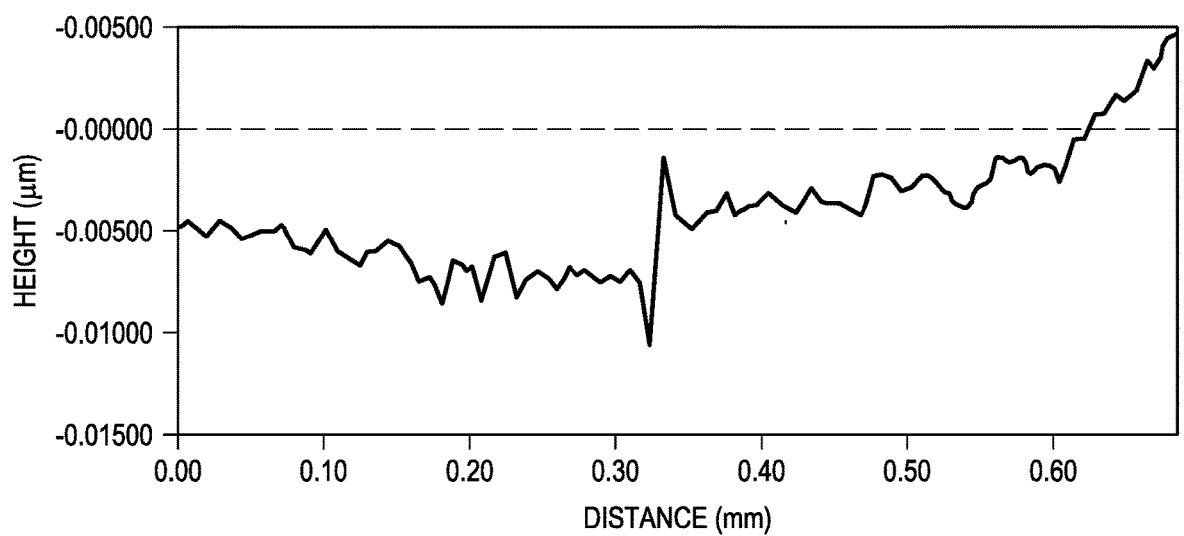
Figure 12B:
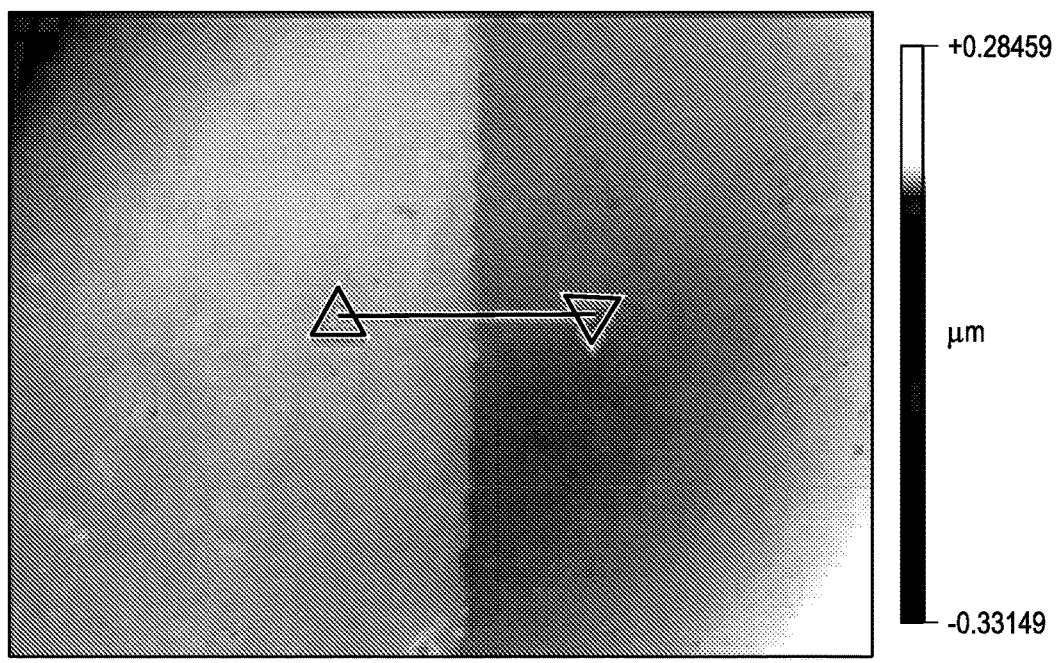
Figure 12B:
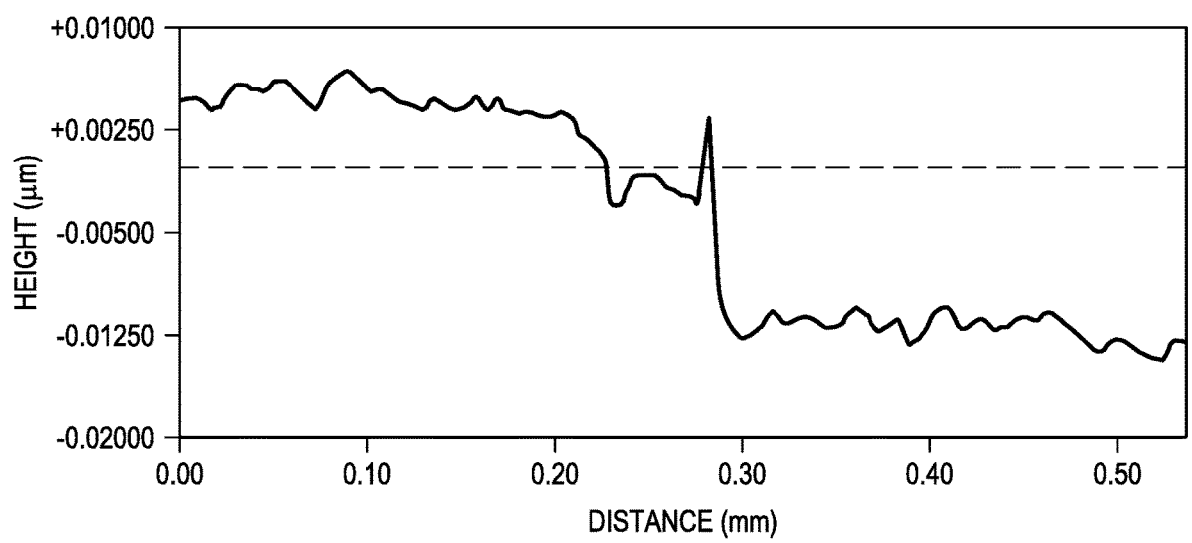
Figure 12C:
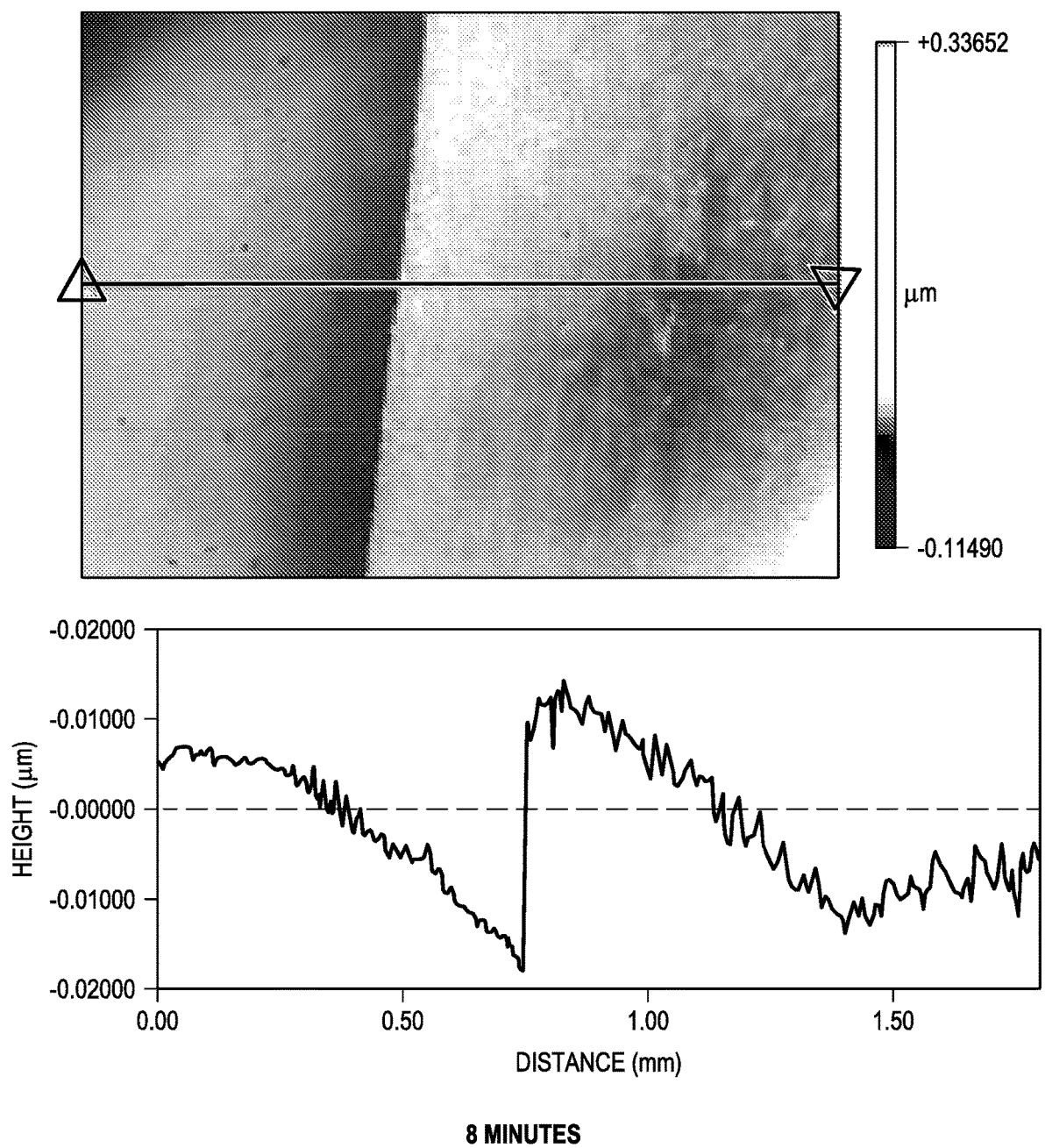
Figure 13:
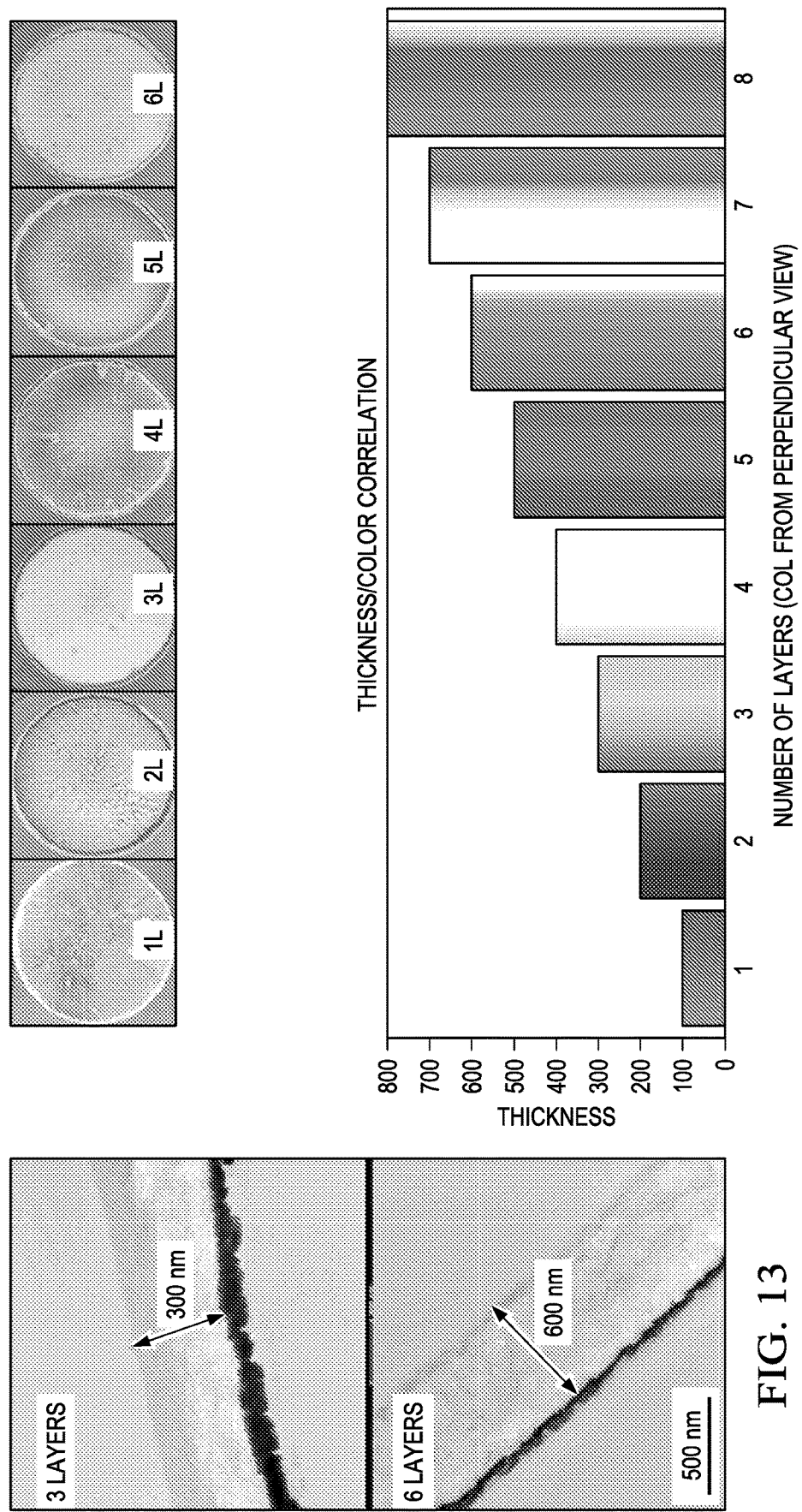
Figure 14:
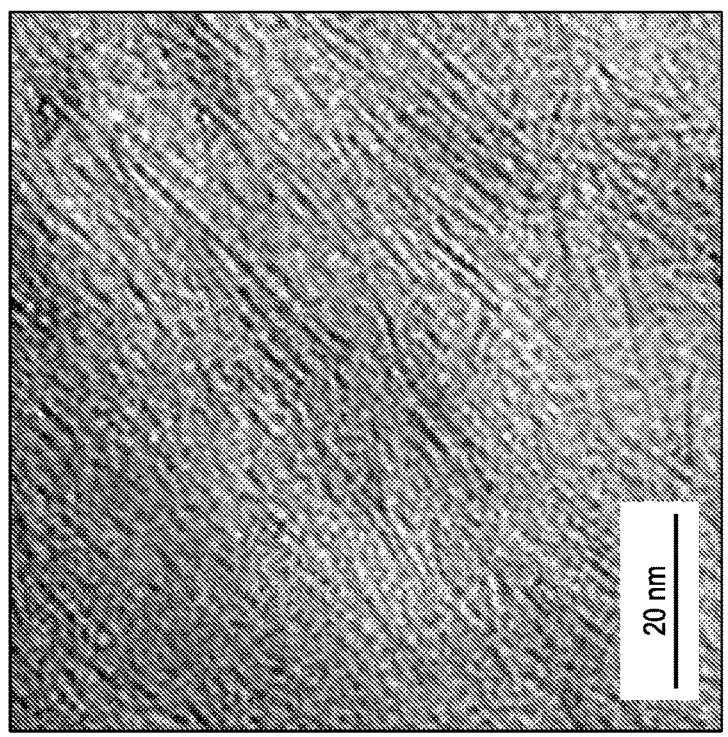
Figure 14:
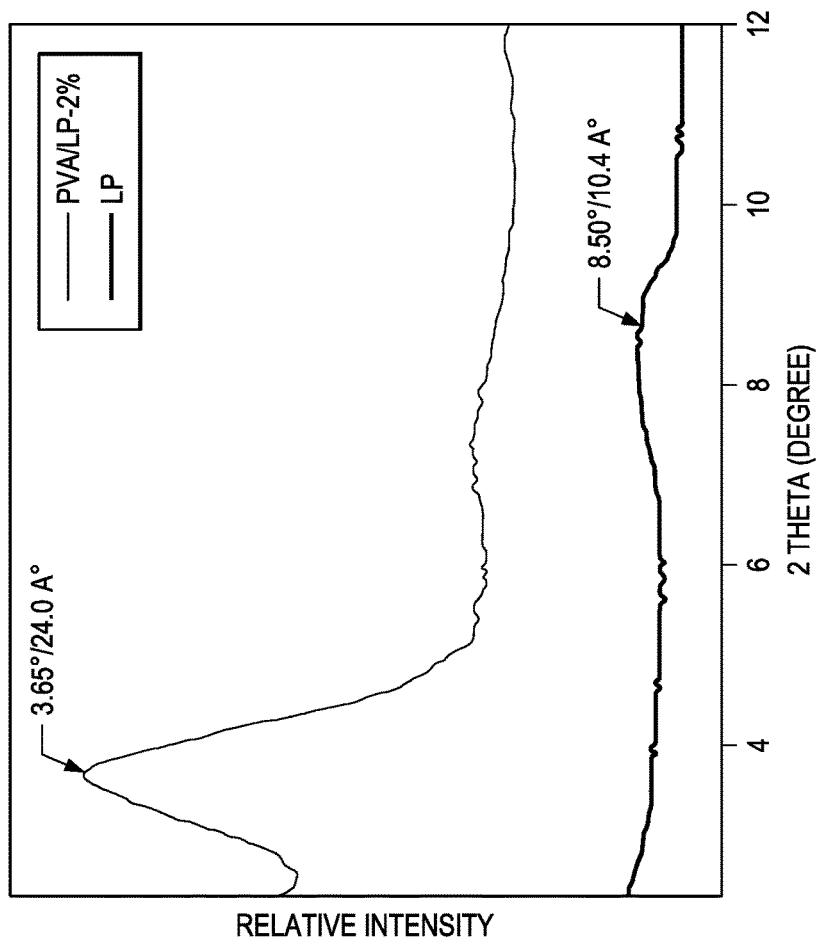
Figure 15:
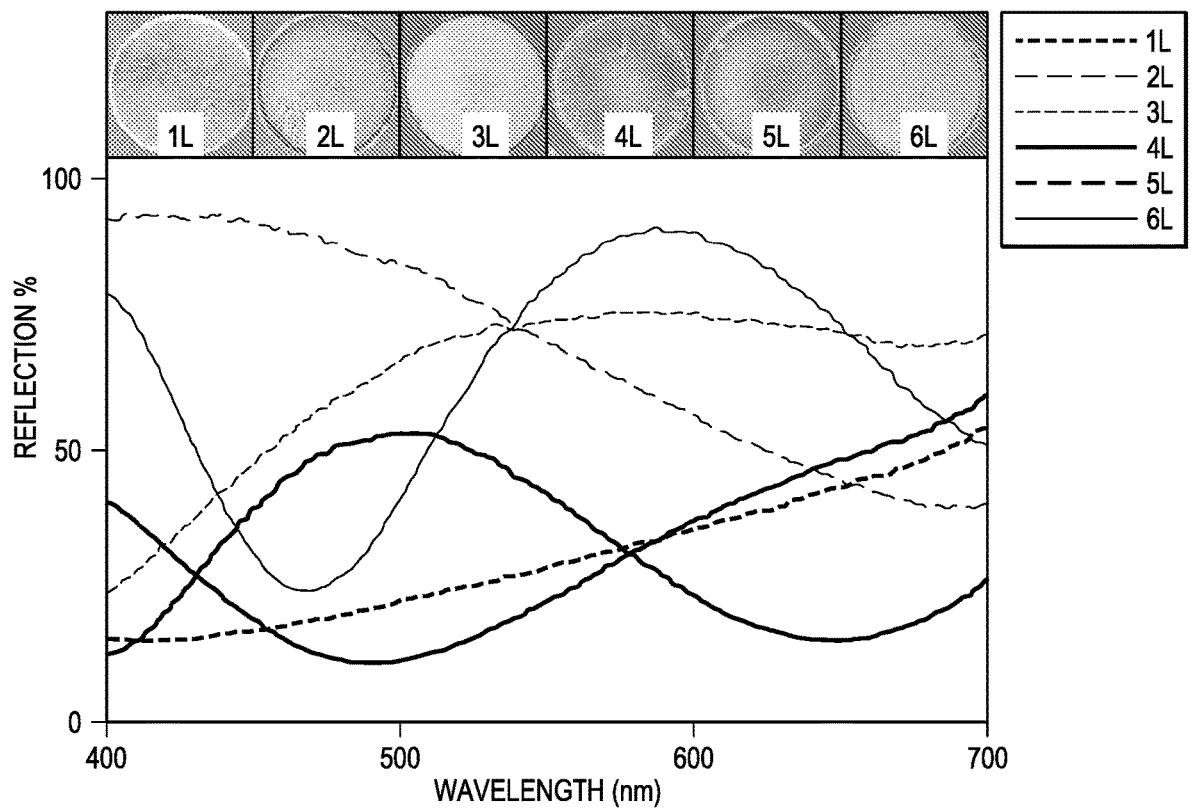
Figure 15:
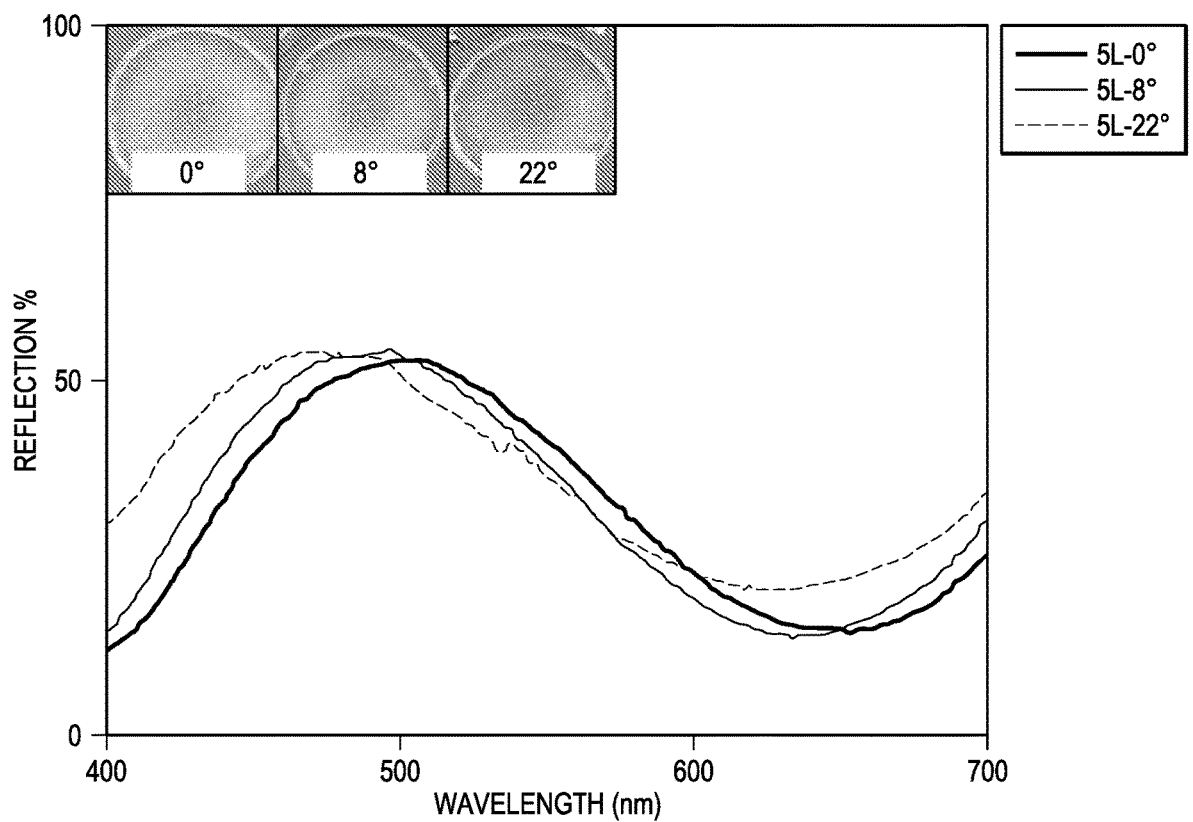
Figure 16:
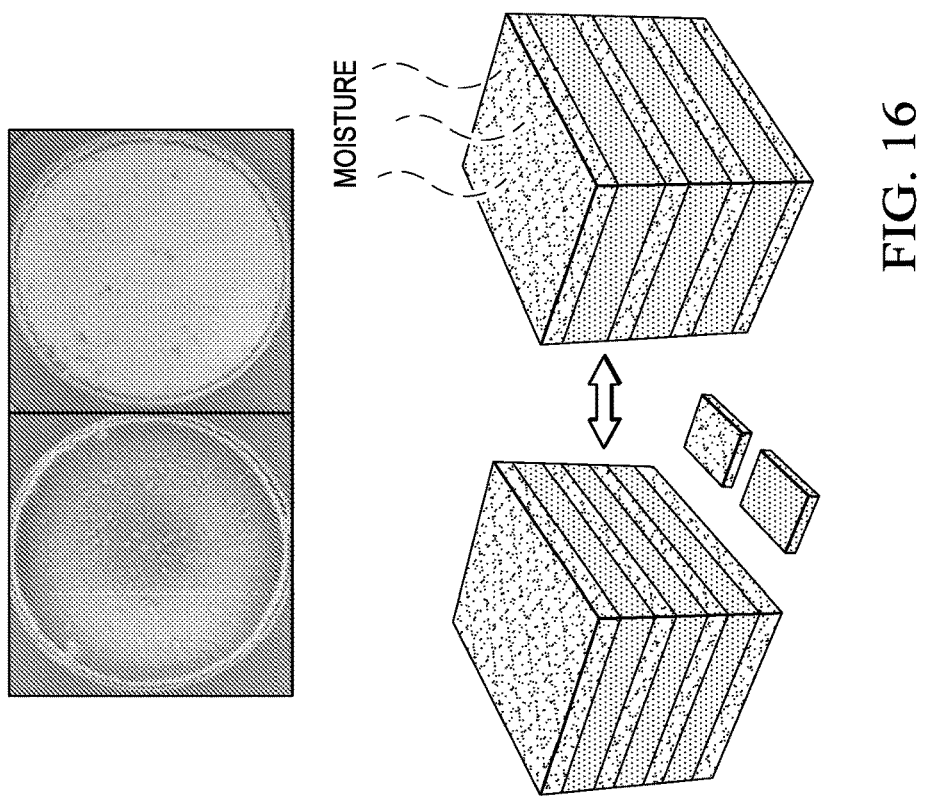
Figure 16:
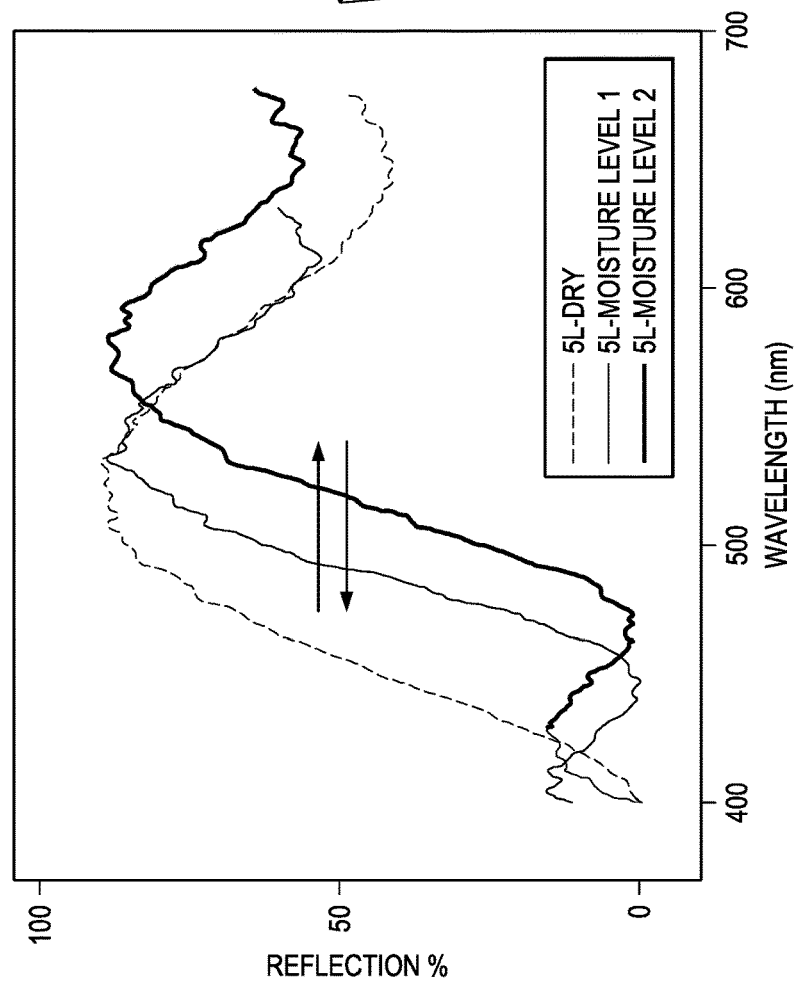
Figure 17:
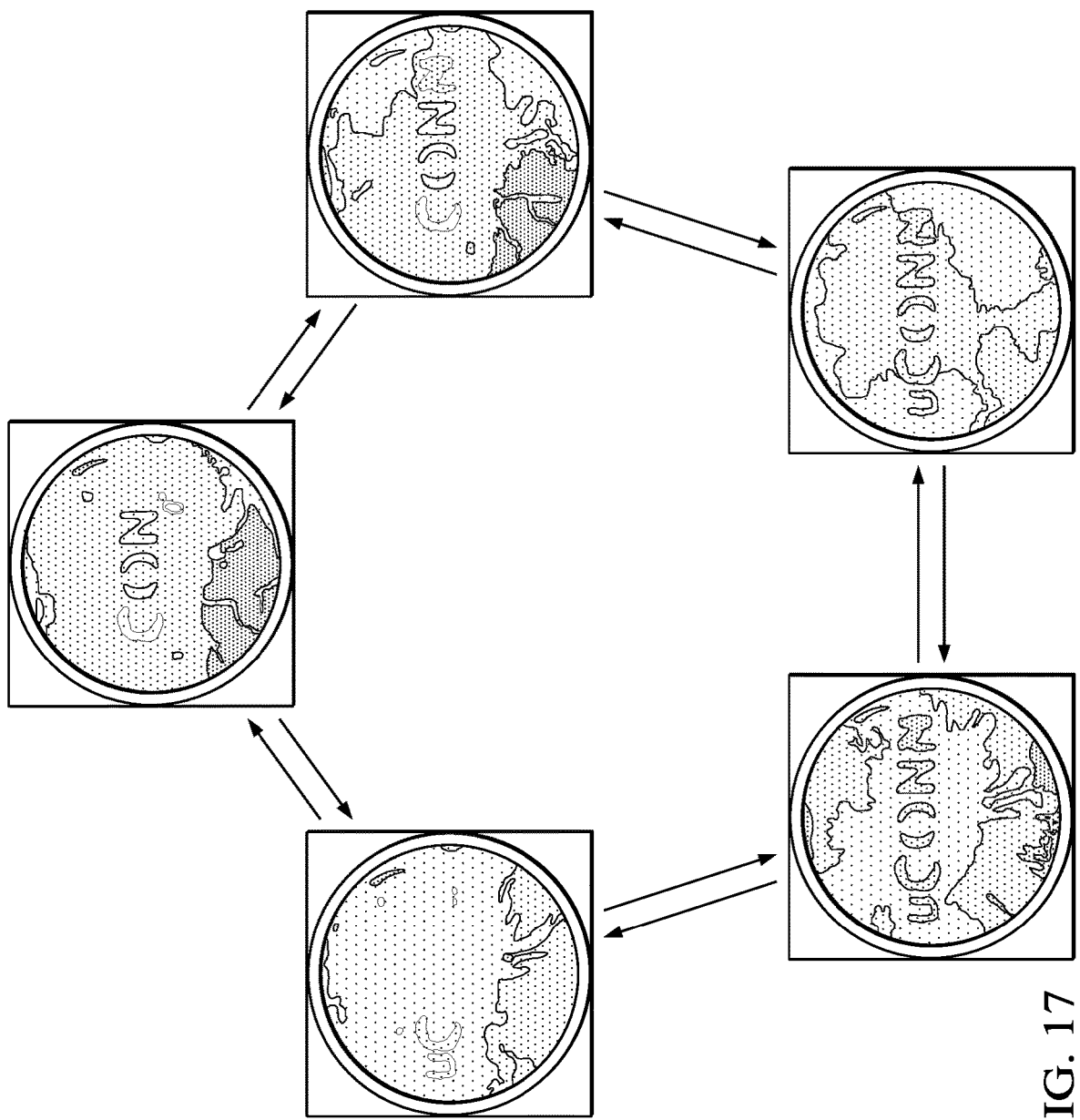
Figure 17:
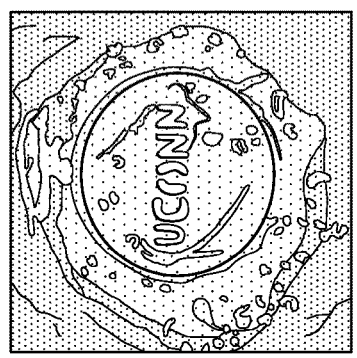

FIG. 7 illustrates a reversible writable UCONN logo pattern which was created to respond to moisture by the chemical crosslinking design of System 3.

FIGS. 8A-8D illustrate that in the absence of exposure to a water cool mist, the coats showed a relatively smooth surface morphology, in which a step height from the highest point to the lowest point was 15 nm. Upon exposure to a cool water mist, however, FIGS. 8E-8H illustrate that the coat thickness was increased significantly in going from the un-crosslinked regions compared to the crosslinked regions, wherein the letter 'N' in the UCONN logo was located, resulting in a step height of 270 nm.

FIGS. 9-17 are presentation materials from the 2016 American Chemical Society Fall Meeting held on Aug. 21, 2016.

DETAILED DESCRIPTION OF THE INVENTION

The unique features of the present invention as described herein include the following: novel functional organic layer/inorganic layer hybrid coating compositions where their interface is specifically tailored to achieve desired performances; demonstration of an interface interaction through physical crosslinking (e.g., hydrogen bonding) between the hydroxyl groups of the hydrophilic polymer and the clay present in the clay-containing organic layer, which is typically a feature that is ignored in the design of hybrid coating compositions; and the use of raw materials that are widely available, environmentally benign, and cost effective.

Suitable hydrophilic polymers for inclusion in the clay-containing layer(s) of the coating compositions of the invention include, but are not limited to, polyethylene glycol (PEG), polyvinyl alcohol (PVA), polyacrylic acid, polysaccharides (e.g., chitosan and cellulose), polyvinylpyrrolidone (PVP), polyacrylamides, polyamines, polyethyleneimines, poly(3,4-ethylenedioxythiophene)-poly(styrenesulfonate), poly(styrenesulfonate), or combinations thereof.

Suitable clays (acting as inorganic nanosheets) for inclusion in the clay-containing layer(s) of the coating compositions of the invention include, but are not limited to, any clay which can be exfoliated in aqueous media, such as montmorillonite, $\alpha$-zirconium phosphates ($Zr(HPO_4)_2 \cdot nH_2O$), graphene oxide, layered double hydroxides, boron nitride, and 2D transition metal dichalcogenides (e.g., $WS_2$, $MoS_2$, $MoSe_2$), or combinations thereof.

Multiple clay-containing layers may be present in the coating compositions of the invention. In an exemplary embodiment, a coating composition may contain 1, 2, 3, 4, 5, 6, 7, 8, 9, 10, 11 or 12 clay-containing layers.

Suitable metals for inclusion in the metal-containing layer of the coating composition include, but are not limited to, metals having a refractive index of <1 or >2 in the visible light range. Examples include, but are not limited to, Al, Au, Ag, Pt, Ti, Cu, Zn, Fe, Ni, Sn, Cr, Co, W, Pd and mixtures thereof.

Suitable crosslinking agents for inclusion in the clay-containing layer(s) of the coating compositions include, but are not limited to, a dialdehyde, boric acid, a borate salt (such as, but not limited to, $Mg_2B_2O_5$, $CaAlB_3O_7$ and $Li_6B_4O_9$) and mixtures thereof. Suitable dialdehydes include those selected from glyoxal, malondialdehyde, succinaldehyde, glutaraldehyde, adipaldehyde, phthalaldehyde, isophthalaldehyde, terephthalaldehyde, 2,6,11,15-tetramethyl-2,4,6,8,10,12,14-hexadecaheptaenedial, 2-hydroxy-5-methyl-1,3-benzenedicarboxaldehyde and 2,5-thiophenedicarboxaldehyde and mixtures thereof.

Suitable thicknesses of the coating composition of the invention (prior to exposure of the composition to water) include, but are not limited to, 30 nm to 5 µm, such as 30 nm to 3 µm, such as 40 nm to 3 µm, such as 40 nm to 2 µm, such as 50 nm to 2 µm, such as 60 nm to 1 µm, such as 70 nm to 1 µm.

Different methods can be used to prepare the coating compositions of the invention, including, but not limited to, the conventional techniques of solvent casting, dip coating, spray coating rod coating, roll-to-roll coating and doctor-blading methods.

The reversibility of the iridescent color change associated with the coating composition was demonstrated by exposure of the composition (in particular, the clay-containing layer of the composition) to water (such as in the form of water vapor, such as a cool water mist) by crosslinking the hydrophilic polymer with the clay, which allowed for the observed swelling/shrinking capability as well as the structural robustness of the coating composition. A key factor for the generation of the iridescent colors is believed to be light interference at the interface between the clay-containing layer and the metal-containing layer and/or between the clay-containing layer and the air.

The ratio of the hydrophilic polymer to the clay in the clay-containing layer of the coating composition was not observed to be dependent upon the generated iridescence but the ratio may affect the time required for the coating composition to respond to water introduced to the composition.

In an exemplary preparation of a coating composition of the invention, a PVA/laponite hybrid nanocoating was spin-coated onto an Au/Pd sputter coated glass slide. Multiple layers of the PVA/laponite coating (of up to 6 layers (6 L)) were applied as needed to the glass slide by repeating the above spin-coating process to achieve the desired thickness of the coating composition. Each coating layer was thoroughly dried on a hot plate before application of the next layer. A few selected samples were further crosslinked regionally using a logo template, where the uncovered region was directly exposed to the crosslinking agent glutaraldehyde, while the covered area remained un-crosslinked. Other samples were alternatively exposed to the crosslinking agent boric acid, while the covered area remained un-crosslinked. After crosslinking, the samples were rinsed with water and dried at room temperature. The entire sample fabrication procedures are shown in FIG. 1. Glutaraldehyde was used to create a permanent crosslinking which created a permanent pattern which can swell/un-swell numerous times in presence/absence of water. By comparison, boric acid was used to create a non-permanent (or dynamic) crosslinking which created a one-time swelling effect in the presence of water, but the crosslinking was destroyed when the water was applied. This phenomenon was referred to as a dynamically reversible pattern.

An interesting iridescent phenomenon was used to illustrate swelling-induced dimensional changes under various conditions, which demonstrates the significance of interface control in the design of the organic/inorganic hybrid coating compositions of the present invention. The relationship between the thickness of the PVA/laponite clay-containing layers and the wavelength of the reflected light is seen in FIG. 5A and FIG. 5B, as well as in other figures. The iridescent color was observed to be generated from the thin-film interference amplified by the highly reflective bottom metal-containing layer.

The ultra-thin nanocomposite coating compositions were also observed to exhibit bright iridescent color changes in response to external (e.g., environmental) factors such as relative humidity and temperature. Additional changes to the observed swell response with regard to changes in pressure are expected to act inversely proportional to temperature responses. Additionally, responses to humidity or other mixtures of water vapor, such as to a cool water mist or moisture was observed to produce a delayed swelling response proportional to the amount of water introduced to the coating compositions. Based on the design and synthesis of the organic/inorganic hybrid coating compositions with various levels of interface, a writable patterned smart coating was fabricated.

The 3-D topography of the nanocoating compositions further demonstrated the swelling degree difference between the crosslinked and the un-crosslinked regions. Before the application of moisture to the surface of a coating composition of the invention, FIGS. 8A-8D indicate an overall smooth surface topography, in which a step height from the highest point to the lowest point is less than 20 nm. In contrast, FIGS. 8E-8H illustrate that after moisture (e.g., a cool water mist) was applied to the composition, the thickness increased much more significantly in the un-crosslinked regions compared to the crosslinked regions, where the letter 'N' of the logo UCONN was located, resulting in a step height of 270 nm.

With reference to the Figures, a unique iridescent phenomenon has been created by exploiting the swelling/shrinking-induced dimensional changes of an organic/inorganic hybrid coating composition of nanometer thickness. This hybrid coating system can be easily prepared, and the raw materials are of low cost and easily obtainable. The tunable interface features of the hybrid organic/inorganic coating compositions make them suitable for applications such as environmental sensors, replacement of pigment-based coatings, and anti-counterfeiting coating/security labels.

The invention claimed is:

1. A composition comprising:
   a. a metal-containing layer comprising a metal having a refractive index of less than 1 or greater than 2 in a visible light range; and
   b. one or more clay-containing layers in direct contact with the metal-containing layer, where the clay-containing layer comprises a clay and a hydrophilic polymer,
   wherein the composition transitions from a non-iridescent state to an iridescent state upon exposure to a water-containing liquid.

2. The composition of claim 1, wherein the metal in the metal-containing layer is selected from the group consisting of Al, Au, Ag, Pt, Ti, Cu, Zn, Fe, Ni, Sn, Cr, Co, W, Pd and combinations thereof.

3. The composition of claim 1, wherein the refractive index is greater than 2 in the visible light range.

4. The composition of claim 1, wherein the metal in the metal-containing layer is Au/Pd.

5. The composition of claim 1, wherein the clay in the one or more clay-containing layers is present as a sheet.

6. The composition of claim 1, wherein the clay in the one or more clay-containing layers is selected from the group consisting of montmorillonite, α-zirconium phosphate (ZrP), graphene oxide, layered double hydroxides, boron nitride, laponite, $WS_2$, $MoS_2$, $MoSe_2$ and mixtures thereof.

7. The composition of claim 1, wherein the clay in the one or more clay-containing layer is laponite.

8. The composition of claim 1, wherein the hydrophilic polymer in the one or more clay-containing layers is selected from the group consisting of polyethylene glycol (PEG), cellulose, chitosan, polyvinyl alcohol (PVA), polyacrylic acid, polyvinylpyrrolidone (PVP), polyacrylamides, polyamines, polyethyleneamines, poly(3,4-ethylenedioxythiophene)-poly(styrenesulfonate), poly(styrenesulfonate) and mixtures thereof.

9. The composition of claim 1, wherein the hydrophilic polymer in the one or more clay-containing layers is polyvinyl alcohol.

10. The composition of claim 1, wherein the metal in the metal-containing layer is Au/Pd, the clay in the one or more clay-containing layers is laponite and the hydrophilic polymer in the one or more clay-containing layers is polyvinyl alcohol.

11. The composition of claim 1, wherein the one or more clay-containing layers further comprises a crosslinking agent.

12. The composition of claim 11, wherein the crosslinking agent is selected from the group consisting of a dialdehyde, boric acid, a borate salt and mixtures thereof.

13. The composition of claim 11, wherein the dialdehyde is glutaraldehyde and the borate salt is borax.

14. The composition of claim 1, wherein at least a portion of the clay and the hydrophilic polymer are crosslinked.

15. The composition of claim 14, wherein the crosslinking between the clay and the hydrophilic polymer is physical crosslinking.

16. The composition of claim 14, wherein the crosslinking between the clay and the hydrophilic polymer is chemical crosslinking.

17. The composition of claim 14, wherein the crosslinking between the clay and the hydrophilic polymer is a combination of physical crosslinking and chemical crosslinking.

18. The composition of claim 17, wherein the crosslinked clay is laponite and the crosslinked hydrophilic polymer is polyvinyl alcohol.

19. The composition of claim 1, wherein the water-containing liquid is in a vapor or mist form.

20. The composition of claim 1, wherein the water-containing liquid is water.

21. The composition of claim 1, wherein the iridescence varies depending on the thickness of the one or more clay-containing layers.

22. The composition of claim 18, wherein the laponite and polyvinyl alcohol are present in a mass ratio of laponite to polyvinyl alcohol of approximately 1:1.

23. A nanocomposite coating comprising the composition of claim 1.

24. The coating of claim 23 wherein the iridescence disappears when the water is substantially removed from the coating.

25. The coating of claim 1 wherein the metal-containing layer is at least 20 nm in thickness.

26. The coating of claim 11 wherein the crosslinking agent is used to create a writable pattern on the coating.

27. A method of coating a surface with an iridescence-generating composition, the method comprising:
   applying to a surface a metal-containing layer comprising a metal with a refractive index less than 1 or greater than 2 in a visible light range;
   applying one or more clay-containing layers comprising a clay and a hydrophilic polymer and directly on the metal-containing layer; and applying a crosslinking agent to the one or more of the clay-containing layers to crosslink at least a portion of the clay with the hydrophilic polymer; and wherein the composition transitions from a non-iridescent state to an iridescent state upon exposure to a water-containing liquid.

28. The method of claim 27, further comprising adding a sufficient amount of water to the one or more clay-containing layers to cause the composition to exhibit iridescence.

29. The method of claim 28, further comprising removing the water to the extent needed to make the iridescence disappear.

30. The method of claim 27 wherein the metal-containing layer has a thickness of at least 20 nm.

31. The method of claim 27, wherein the metal in the metal-containing layer is Au/Pd, the clay in the one or more clay-containing layers is laponite and the hydrophilic polymer in the one or more clay-containing layers is polyvinyl alcohol.

32. The method of claim 31, further comprising applying additional layers of the clay-containing layer as needed to achieve desired iridescence of the composition.

33. The method of claim 27 wherein the crosslinking agent is used to create a writable pattern.

34. An article coated with the composition of claim 27.

* * * * *